(12) United States Patent
Yoshioka

(10) Patent No.: US 12,149,225 B2
(45) Date of Patent: Nov. 19, 2024

(54) PIEZOELECTRIC VIBRATING DEVICE

(71) Applicant: DAISHINKU CORPORATION, Kakogawa (JP)

(72) Inventor: Hiroki Yoshioka, Kakogawa (JP)

(73) Assignee: DAISHINKU CORPORATION, Hyogo (JP)

( * ) Notice: Subject to any disclaimer, the term of this patent is extended or adjusted under 35 U.S.C. 154(b) by 676 days.

(21) Appl. No.: 17/429,914

(22) PCT Filed: Feb. 12, 2020

(86) PCT No.: PCT/JP2020/005308
§ 371 (c)(1),
(2) Date: Aug. 10, 2021

(87) PCT Pub. No.: WO2020/202814
PCT Pub. Date: Aug. 10, 2020

(65) Prior Publication Data
US 2022/0216847 A1    Jul. 7, 2022

(30) Foreign Application Priority Data
Mar. 29, 2019   (JP) .................. 2019-065727

(51) Int. Cl.
*H03H 9/05*   (2006.01)
*H03H 9/10*   (2006.01)

(52) U.S. Cl.
CPC ........ *H03H 9/0547* (2013.01); *H03H 9/1035* (2013.01)

(58) Field of Classification Search
CPC ........................... H03H 9/0547; H03H 9/1035
See application file for complete search history.

(56) References Cited

U.S. PATENT DOCUMENTS

| | | | |
|---|---|---|---|
| 2002/0036546 A1* | 3/2002 | Hatanaka | H03B 5/32 331/116 R |
| 2005/0184626 A1* | 8/2005 | Chiba | H03H 9/0547 310/348 |
| 2011/0228501 A1* | 9/2011 | Chiba | H03H 9/0542 361/767 |
| 2019/0312189 A1* | 10/2019 | Kojo | H03B 5/32 |
| 2020/0044623 A1* | 2/2020 | Kojo | H03H 9/0552 |

FOREIGN PATENT DOCUMENTS

| | | |
|---|---|---|
| JP | 6-224681 A | 8/1994 |
| JP | 2002-100949 A | 4/2002 |
| JP | 2004-320420 A | 11/2004 |
| JP | 2005-006030 A | 1/2005 |
| JP | 2011-199579 A | 10/2011 |
| JP | 2017-46206 A | 3/2017 |
| WO | 2018/092776 A1 | 5/2018 |
| WO | 2018/097132 A1 | 5/2018 |

* cited by examiner

*Primary Examiner* — Bryan P Gordon
(74) *Attorney, Agent, or Firm* — Norris McLaughlin, P.A.

(57) ABSTRACT

Among a plurality of electrodes for mounting purpose, all of the electrodes for mounting purpose but two paired ones of the electrodes for mounting purpose that are connected to driving electrodes each have a wiring pattern for use in electrical connection between terminals for external connection and mounting terminals of IC. These wiring patterns each have a constricted portion smaller in width than the other portions that prevents the conduction of heat.

18 Claims, 8 Drawing Sheets

PIEZOELECTRIC VIBRATING DEVICE

TECHNICAL FIELD

The present invention relates to a piezoelectric vibration device for use in variously different electronic instruments including communication devices.

BACKGROUND ART

Surface-mounted piezoelectric vibrators and piezoelectric oscillators are typical examples of the piezoelectric vibration devices which have been and are currently used in a broad range of applications. For example, temperature-compensated piezoelectric oscillators operable to compensate frequency-temperature characteristics of piezoelectric vibrators are more commonly used as frequency sources for mobile communication devices that are often exposed to different thermal environments.

Such a temperature-compensated piezoelectric oscillator is equipped with an integrated circuit element that includes a temperature sensor and a temperature-compensated circuit. The temperature-compensated piezoelectric oscillator is configured to generate a compensation voltage to control an oscillation frequency based on temperatures detected by the temperature sensor embedded in the integrated circuit element (for example, patent literature 1).

CITATION LIST

Patent Literature

Patent Literature 1: JP 2005-006030 A

SUMMARY OF INVENTION

Technical Problem

In such a surface-mounted, temperature-compensated piezoelectric oscillator, terminals for external connection are joined, with a joining material such as solder, to an external circuit board. When electronic components mounted to the external circuit board, which are a heat source (for example, power transistors), are turned on and supplied with electric current, the electronic components start to generate heat, and the generated heat is conducted to the terminals for external connection of the temperature-compensated piezoelectric oscillator mounted to this circuit board.

In the temperature-compensated piezoelectric oscillator, the integrated circuit element is directly connected to the terminals for external connection via, for example, an internal wiring, while the piezoelectric vibrator is connected to the integrated circuit element via an internal wiring. Thus, the piezoelectric vibrator is not directly connected to the terminals for external connection unlike the integrated circuit element.

Then, heat generated from the heat source of the external circuit board and conducted to the terminals for external connection of the temperature-compensated piezoelectric oscillator is then rapidly conducted to the integrated circuit element via the internal wiring and the terminals for external connection that excel in thermal conductivity. The temperature rise of the integrated circuit element may accordingly exhibit a sharper gradient than that of the piezoelectric vibrator, leading to greater temperature differences between the integrated circuit element and the piezoelectric vibrator. As a result, accurate temperature compensation may be difficult to perform, inviting frequency variations, i.e., generally called frequency drift, until the state of thermal equilibrium is reached between the piezoelectric vibrator and the integrated circuit element with less or no temperature difference between them.

This frequency drift may certainly occur when the electronic components; heat source, mounted to the external circuit board are turned on and supplied with electric current but may also occur when the electronic components are electrically turned off. When the electronic components; heat source; mounted to the external circuit board are electrically turned off, heat generated from the electronic components may no longer be conducted to the temperature-compensated piezoelectric oscillator, causing the temperature of the temperature-compensated piezoelectric oscillator to drop to lower degrees. At the time, heat from the integrated circuit element may be rapidly conducted to and radiated from the terminals for external connection via the internal wiring that excel in thermal conductivity. The temperature drop of the integrated circuit element may accordingly exhibit a sharper gradient than that of the piezoelectric vibrator, leading to greater temperature differences between the integrated circuit element and the piezoelectric vibrator. Then, the frequency drift may be likely to occur until the state of thermal equilibrium is reached between the piezoelectric vibrator and the integrated circuit element with less or no temperature difference between them.

Thus, the frequency drift may be inevitable in response to ON and OFF of electric current supply to the electronic components; heat source, of the external circuit board mounted with the temperature-compensated piezoelectric oscillator. This unfavorable event may be particularly noticeable with any electronic devices in which electronic components are electrically turned on and off relatively often.

The present invention addresses these issues and is directed to minimizing the risk of such undesired temperature differences that may occur between the piezoelectric vibrator and the integrated circuit element under heat conducted from the external circuit board mounted with the piezoelectric vibration device.

Solutions to the Problems

To this end, the present invention provides the following technical features.

A piezoelectric vibration device is provided that includes:
a piezoelectric vibrator including a plurality of terminals for external connection and a plurality of electrodes for mounting purpose; and
an integrated circuit element including a plurality of mounting terminals connectable to the plurality of electrodes for mounting purpose, the piezoelectric vibrator being mountable to the integrated circuit element.

The piezoelectric vibration device is further characterized in that
the piezoelectric vibrator includes:
a piezoelectric vibration plate including driving electrodes formed on main surfaces on both sides thereof;
a first sealing member allowed to cover and seal one of the main surfaces of the piezoelectric vibration plate; and
a second sealing member allowed to cover and seal the other one of the main surfaces of the piezoelectric vibration plate,
among the plurality of electrodes for mounting purpose, two paired electrodes for mounting purpose are electrically connected to the driving electrodes formed on the main surfaces, and a plurality of remaining electrodes for mounting purpose are electrically connected to the plurality of terminals for external connection, the plurality of remaining electrodes for mounting purpose each have a wiring pattern for use in electrical connection between a respective one of the plurality of terminals for external connection and a respective one of the plurality of mounting terminals of the integrated circuit element, and the wiring pattern in at least one of the plurality of remaining electrodes for mounting purpose has a constricted portion smaller in width than other portions thereof.

The present invention is characterized in that a plurality of remaining electrodes for mounting purpose, other than two paired electrodes for mounting purpose connected to the driving electrodes on the main surfaces of the piezoelectric vibration plate, each have a wiring pattern for use in electrical connection between a respective one of the terminals for external connection and a respective one of the mounting terminals of the integrated circuit element. The wiring pattern in at least one of the remaining ones of the electrodes for mounting purpose has a constricted portion smaller in width than the other portions thereof that prevents the conduction of heat. In case heat is generated from a heat source in an external circuit board mounted with the piezoelectric vibration device, the generated heat may be conducted from the terminals for external connection of the piezoelectric vibration device to the integrated circuit element via the wiring patterns. According to the present invention, however, the constricted portion(s) of the wiring pattern(s) may prevent the heat thus generated from being conducted to the integrated circuit element. Thus, the integrated circuit element may be allowed to have a moderate gradient of temperature rise. This may ensure effective control of possible temperature differences between the integrated circuit element and the piezoelectric vibrator, allowing the state of thermal equilibrium to be quickly reached between the integrated circuit element and the piezoelectric vibrator.

When, for example, the heat source of the external circuit board no longer generates heat, inviting the piezoelectric vibration device to drop its temperature to lower degrees, heat from the integrated circuit element may be conducted to and radiated from the terminals for external connection via the wiring patterns. According to the present invention, however, the conduction of heat at the time may be effectively prevented by the constricted portion(s) of the wiring pattern(s). Thus, the integrated circuit element may be allowed to have a moderate gradient of temperature drop. This may ensure effective control of possible temperature differences between the integrated circuit element and the piezoelectric vibrator, allowing the state of thermal equilibrium to be quickly reached between the integrated circuit element and the piezoelectric vibrator.

The piezoelectric vibrator has a multilayered structure including three layers; the piezoelectric vibration plate having main surfaces on which the driving electrodes are formed, and the first and second sealing members covering and sealing the main surfaces. The piezoelectric vibrator thus structured may be advantageously reduced in thickness (reduced in height) as compared with, for example, such a packaging structure that piezoelectric vibration pieces are each housed in the housing space of a container and sealed with a lid member.

In a preferred embodiment of the piezoelectric vibration device according to the present invention, the wiring patterns in all of the plurality of remaining electrodes for mounting purpose may each have the constricted portion smaller in width.

According to the present invention, heat, if generated by the heat source of the external circuit board mounted with the piezoelectric vibration device and conducted from the terminals for external connection to the integrated circuit element via the wiring patterns, may be more effectively prevented from being thus conducted to the integrated circuit element. When, for example, the heat source of the external circuit board no longer generates heat, heat from the integrated circuit element possibly conducted to and radiated from the terminals for external connection via the wiring patterns may be more effectively prevented from being thus conducted to and radiated from these terminals. This may ensure more effective control of possible temperature differences between the integrated circuit element and the piezoelectric vibrator, allowing the state of thermal equilibrium to be more quickly reached between the integrated circuit element and the piezoelectric vibrator.

In one embodiment of the piezoelectric vibration device according to the present invention, the plurality of electrodes for mounting purpose may be disposed on an outer surface of the first sealing member, the plurality of terminals for external connection may be disposed on an outer surface of the second sealing member, and the piezoelectric vibrator may include a plurality of through electrodes penetrating through the first sealing member, the piezoelectric vibration plate and the second sealing member in a direction of thickness thereof, and the plurality of remaining electrodes for mounting purpose may be electrically connected to the plurality of terminals for external connection via the plurality of through electrodes.

According to this embodiment, the terminals for external connection joined to the external circuit board are formed on the outer surface of the second sealing member on one surface of the piezoelectric vibrator, the electrodes for mounting purpose connected to the mounting terminals of the integrated circuit element are formed on the outer surface of the first sealing member on the other surface of the piezoelectric vibrator, and the plurality of remaining electrodes for mounting purpose are electrically connected to the plurality of terminals for external connection via the plurality of through electrodes penetrating through the first sealing member, the piezoelectric vibration plate and the second sealing member in a direction of their thickness.

In the piezoelectric vibration device thus characterized, heat generated by the heat source of the external circuit board mounted with the piezoelectric vibration device may be conducted to the mounting terminals of the integrated circuit element via the following electrodes and terminals of the piezoelectric vibration device; the remaining electrodes for mounting purpose, the through electrodes and the terminals for external connection that excel in thermal conductivity. In this instance, the conduction of heat at the time may be prevented by the constricted portion(s) of the wiring pattern(s) in the remaining electrodes(s) for mounting purpose, which may slow down the rate of thermal conduction to the integrated circuit element. Thus, the integrated circuit element may be allowed to have a moderate gradient of temperature rise. This may ensure effective control of possible temperature differences between the integrated circuit element and the piezoelectric vibrator, allowing the state of thermal equilibrium to be quickly reached between the integrated circuit element and the piezoelectric vibrator.

When, for example, the heat source of the external circuit board no longer generates heat, heat from the integrated circuit element may be conducted from the mounting terminals to the remaining electrodes for mounting purpose, the through electrodes and the terminals for external connection, and then radiated from there. According to the present invention, however, the conduction of heat at the time may be effectively prevented by the constricted portion(s) of the wiring pattern(s) in the remaining electrodes for mounting purpose. Thus, the integrated circuit element may be allowed to have a moderate gradient of temperature drop. This may ensure effective control of possible temperature differences between the integrated circuit element and the piezoelectric vibrator, allowing the state of thermal equilibrium to be quickly reached between the integrated circuit element and the piezoelectric vibrator.

In another embodiment of the piezoelectric vibration device according to the present invention, the constricted portion of the wiring pattern may be formed at a position closer to a respective one of the plurality of through electrodes than a connecting portion for connection between a respective one of the plurality of electrodes for mounting purpose and a respective one of the plurality of mounting terminals of the integrated circuit element.

According to this embodiment, the constricted portion(s) that serves to prevent the conduction of heat is formed at a position(s) closer to the through electrode(s) of the wiring pattern(s) for use in electrical connection between the through electrode(s) and the mounting terminal(s) of the integrated circuit element, i.e., at a position(s) away from the mounting terminals of the integrated circuit element. The conduction of heat may be thus controllable away from the mounting terminals of the integrated circuit element.

In yet another embodiment of the piezoelectric vibration device according to the present invention, the constricted portion of the wiring pattern may be formed outside of a mounting region where the integrated circuit element is mounted.

According to this embodiment, the constricted portions that serve to prevent the conduction of heat are formed in any region but the region where the integrated circuit element is mounted. Thus, the conduction of heat may be controllable away from the mounting region of the integrated circuit element.

In one embodiment of the piezoelectric vibration device according to the present invention, the constricted portion of the wiring pattern may be smaller than or equal to 40 μm in width.

In this embodiment that defines the constricted portion of the wiring pattern to 40 μm or less in width, the conduction of heat may be quite effectively controllable.

In yet another embodiment of the piezoelectric vibration device according to the present invention, the plurality of mounting terminals may be disposed at positions closer to an outer circumference of the integrated circuit element, and the two paired electrodes for mounting purpose electrically connected to the driving electrodes formed on the main surfaces may each have a wiring pattern for driving electrode extending more inward than the plurality of mounting terminals in the mounting region where the integrated circuit element is mounted.

According to this embodiment, the two paired electrodes for mounting purpose electrically connected to the driving electrodes formed on the main surfaces of the piezoelectric vibration plate in the piezoelectric vibrator each have a wiring pattern for driving electrode extending more inward than the mounting terminals in the mounting region of the integrated circuit element. In case the integrated circuit element is heated and elevated to higher temperature degrees than that of the piezoelectric vibrator, heat radiated from the heated integrated circuit element may heat the wiring patterns for driving electrode, and heat from these heated wiring patterns may be efficiently conducted to the piezoelectric vibrator. Thus, possible temperature differences between the integrated circuit element and the piezoelectric vibrator may be even more speedily minimized or reduced to zero, allowing the state of thermal equilibrium to be quickly reached between the integrated circuit element and the piezoelectric vibrator.

In yet another embodiment of the piezoelectric vibration device according to the present invention, the wiring patterns for driving electrode of the two paired electrodes for mounting purpose may be substantially symmetric to each other in which a point of symmetry is a central position of the mounting region of the integrated circuit element.

According to this embodiment characterized in that the wiring patterns for driving electrode of the two paired electrodes for mounting purpose are substantially point-symmetric about the central position of the mounting region of the integrated circuit element, the wiring patterns for driving electrode may be substantially equally heated by heat radiated from the integrated circuit element. Then, heat from the wiring patterns for driving electrode thus heated may be conducted to the main surfaces of the piezoelectric vibration plate, and temperatures of the main surfaces of the piezoelectric vibration plate may be both elevated to higher degrees in a balanced manner.

In a preferred embodiment of the piezoelectric vibration device according to the present invention, the wiring patterns for driving electrode of the two paired electrodes for mounting purpose may be at least extended as far as a near-center position in the mounting region of the integrated circuit element.

According to this embodiment characterized in that the wiring patterns for driving electrode of the electrodes for mounting purpose are at least extended as far as a near-center position in the mounting region of the integrated circuit element, the wiring patterns for driving electrode may be efficiently heated by heat radiated from a near-center part of the integrated circuit element driven and heated to high temperatures. Thus, heat from the heated wiring patterns for driving electrodes may be conducted to the piezoelectric vibrator, by which the piezoelectric vibrator may be efficiently heated and elevated to higher temperature degrees.

Effects of the Invention

The present invention is advantageously characterized in that the remaining electrodes for mounting purpose, other than the two paired electrodes for mounting purpose that are connected to the driving electrodes on the main surfaces of the piezoelectric vibration plate, each have a wiring pattern for use in electrical connection between a respective one of the terminals for external connection and a respective one of the mounting terminals of the integrated circuit element, and the wiring pattern in at least one of the remaining electrodes for mounting purpose has a constricted portion smaller in width than the other portions that prevents the conduction of heat. Possibly, heat generated from a heat source of the external circuit board mounted with the piezoelectric vibration device may be conducted, from the terminals for external connection of the piezoelectric vibration device, to the integrated circuit element via the wiring patterns. In case such an event occurs, however, the present invention may successfully prevent the conduction of heat at the time using the constricted portion(s) of the wiring pattern(s). Thus, the integrated circuit element may be allowed to have a moderate gradient of temperature rise. This may ensure effective control of possible temperature differences between the integrated circuit element and the piezoelectric vibrator, allowing the state of thermal equilibrium to be quickly reached between the integrated circuit element and the piezoelectric vibrator.

When, for example, the heat source of the external circuit board no longer generates heat, heat from the integrated circuit element may be conducted to and radiated from the terminals for external connection via the wiring patterns. In case of such an event, heat from the integrated circuit element may be conducted, from the mounting terminals of this circuit element, to the terminals for external connection via the wiring patterns, and then radiated from there. According to the present invention, the conduction of heat at the time may be effectively prevented by the constricted portion(s) of the wiring pattern(s). Thus, the integrated circuit element may be allowed to have a moderate gradient of temperature drop. This may ensure effective control of possible temperature differences between the integrated circuit element and the piezoelectric vibrator, allowing the state of thermal equilibrium to be quickly reached between the integrated circuit element and the piezoelectric vibrator.

The piezoelectric vibrator has a multilayered structure including three layers; the piezoelectric vibration plate having main surfaces on which the driving electrodes are formed, and the first and second sealing members covering and sealing the main surfaces. The piezoelectric vibrator thus structured may be advantageously reduced in thickness (reduced in height) as compared with, for example, such a packaging structure that piezoelectric vibration pieces are each housed in the housing space of a container and sealed with a lid member.

DESCRIPTION OF EMBODIMENTS

An embodiment of the present invention is hereinafter described with reference to the accompanying drawings. In this embodiment, a temperature-compensated crystal oscillator is described as an example of the piezoelectric vibration device according to the present invention.

First Embodiment

Figure 1:
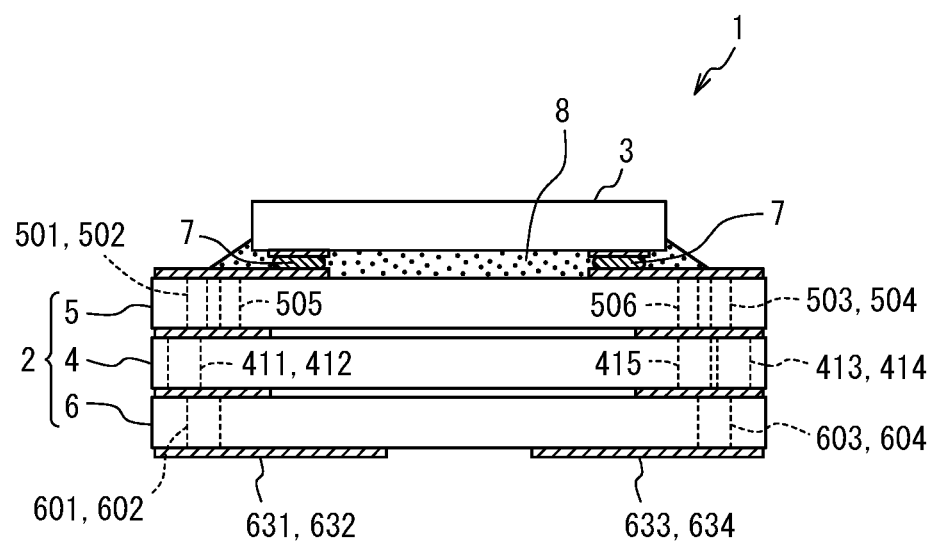
FIG. 1 is a schematic structural view of a temperature-compensated crystal oscillator according to an embodiment of the present invention.

FIG. 1 is a schematic structural view of a temperature-compensated crystal oscillator according to an embodiment of the present invention.

A temperature-compensated crystal oscillator 1 according to this embodiment includes a crystal vibrator 2, and an IC3; integrated circuit element, mounted to the crystal vibrator 2.

The crystal vibrator 2 includes a crystal vibration plate 4; an example of the piezoelectric vibration plate, a first sealing member 5 used to cover and air-tightly seal the side of one main surface of the crystal vibration plate 4, and a second sealing member 6 used to cover and air-tightly seal the side of the other main surface of the crystal vibration plate 4.

The crystal vibrator 2 is produced in the form of a sandwich-like multilayered package in which the first and second sealing members 5 and 6 are respectively joined to one and the other main surfaces of the crystal vibration plate 4. The package of the crystal vibrator 2 has a cuboidal shape and is rectangular in plan view. In this embodiment, this package is in the size of, for example, 1.0 mm×0.8 mm in plan view and is thus reduced in size and height.

This package may be thus sized, or the size of this package may be selected from other applicable dimensions.

The IC3 mounted to the crystal vibrator 2 is an integrated circuit element having a cuboidal outer shape in which an oscillator circuit, a temperature sensor and a temperature-compensated circuit are combined into one chip.

The crystal vibration plate 4 and the first and second sealing members 5 and 6 of the crystal vibrator 2 are hereinafter described.

Figure 2:
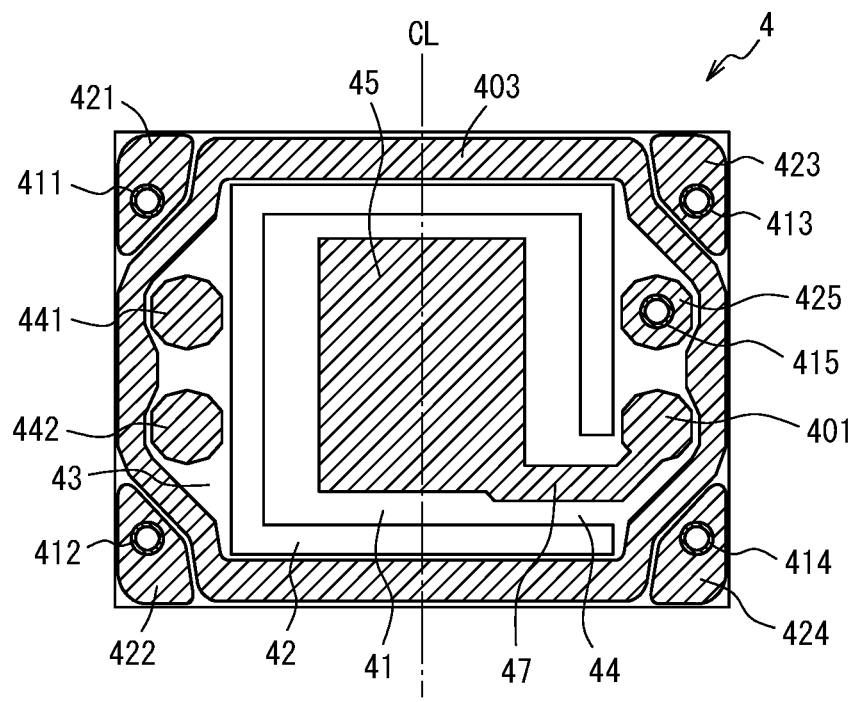
FIG. 2 is a schematic plan view illustrating the side of one main surface of a crystal vibration plate shown FIG. 1.
Figure 3:
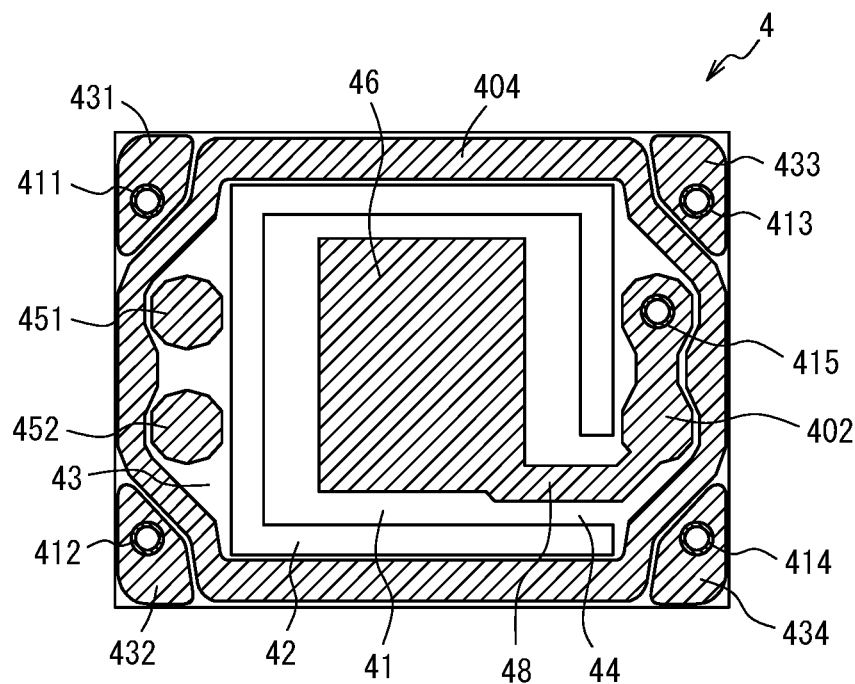
FIG. 3 is a schematic plan view illustrating the side of the other main surface of the crystal vibration plate seen through from the side of the one main surface of the crystal vibration plate shown FIG. 1.

FIG. 2 is a schematic plan view illustrating the side of one main surface of the crystal vibration plate 4. FIG. 3 is a schematic plan view illustrating the side of the other main surface of the crystal vibration plate 4 seen through from the one main-surface side.

In the description given below, a front surface is used to refer to one main surface closer to the IC3 (upper side in FIG. 1), and a back surface is used to refer to the other main surface away from the IC3 (lower side in FIG. 1). FIG. 2 is a schematic plan view illustrating the front-surface side of the crystal vibration plate 4, and FIG. 3 is a schematic plan view illustrating the back-surface side of the crystal vibration plate 4 seen through from the front-surface side.

The crystal vibration plate 4 according to this embodiment is an AT-cut crystal plate, main surfaces of which on front and back sides are both XZ' planes.

The crystal vibration plate 4 includes a substantially rectangular vibrating portion 41, a frame portion 43 surrounding the vibrating portion 41 across a space (void) 12, and a coupling portion 44 that allows the vibrating portion 41 and the frame portion 43 to be coupled to each other. The vibrating portion 41, the frame portion 43 and the coupling portion 44 are formed as an integral unit. Though not illustrated in the drawings, the vibrating portion 41 and the coupling portion 44 are smaller in thickness than the frame portion 43.

First and second driving electrodes 45 and 46 are formed in a pair on main surfaces on front and back sides of the vibrating portion 41. First and second extraction electrodes 47 and 48 are respectively extracted from the first and second driving electrodes 45 and 46. The first extraction electrode 47 on the front-surface side is extracted, via the coupling portion 44, to a junction pattern 401 for connecting purpose formed in the frame portion 43. The second extraction electrode 47 on the back-surface side is extracted, via the coupling portion 44, to a junction pattern 402 for connecting purpose formed in the frame portion 43. The junction pattern 402 for connecting purpose is formed so as to extend along a short side of the crystal vibration plate 4 rectangular in plan view and to surround a fifth through electrode 415 described later.

In this embodiment, the vibrating portion 41 is coupled to the frame portion 43 with the coupling portion 44 at one position. This may reduce any stress possibly acted upon the vibration portion 41, as compared with the vibrating portion 41 being coupled to the frame portion 43 with the coupling portion 44 at two or more positions.

Figure 5:
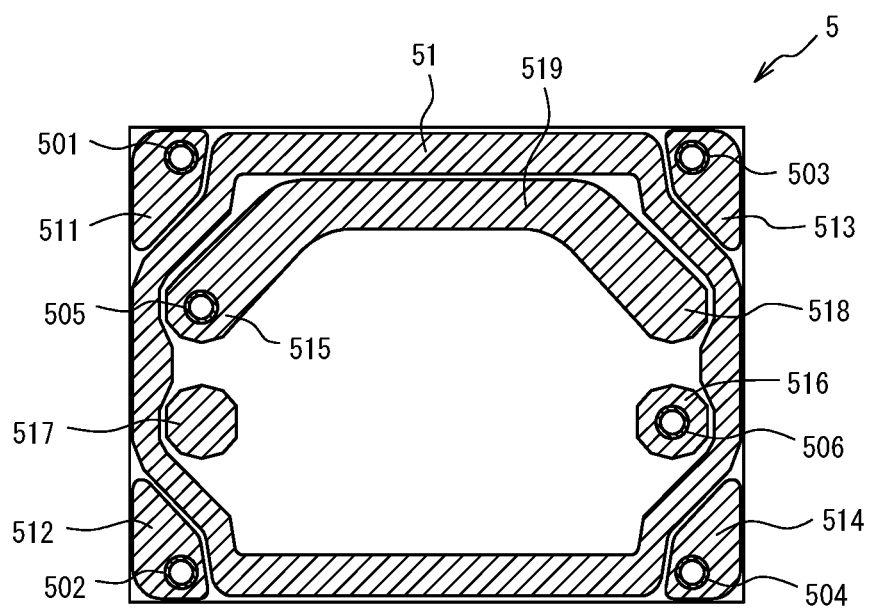
FIG. 5 is a schematic plan view illustrating the side of the other main surface of the first sealing member seen through from the side of the one main surface of the first sealing member shown in FIG. 1.
Figure 6:
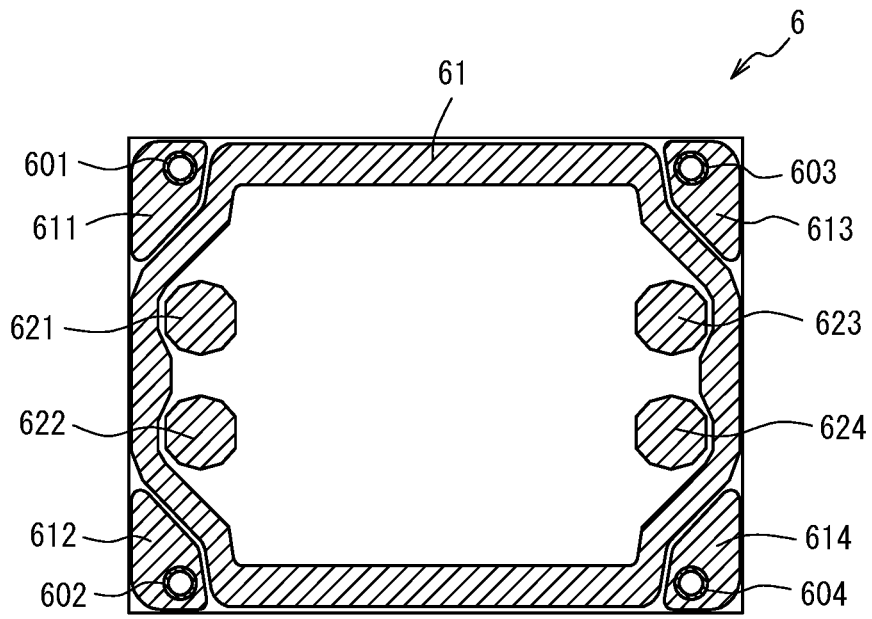
FIG. 6 is a schematic plan view illustrating the side of one main surface of a second sealing member shown in FIG. 1.

On the front and back main surfaces of the crystal vibration plate 4 are respectively formed first and second junction patterns 403 and 404 for sealing purpose serving to join the crystal vibration plate 4 to the first and second sealing members 5 and 6. The first and second junction patterns 403 and 404 for sealing purpose on these main surfaces are formed in a circular shape along the outer circumference of the frame portion 43 and substantially along the outer peripheral edge of the crystal vibration plate 4 except its four corners. As illustrated in FIG. 5, a first junction pattern 51 for sealing purpose is formed on the back surface of the first sealing member 5. This junction pattern 51 for sealing purpose is formed correspondingly to the first junction pattern 403 for sealing purpose on the front surface of the crystal vibration plate 4. As illustrated in FIG. 6, a second junction pattern 61 for sealing purpose is formed on the front surface of the second sealing member 6. This junction pattern 61 for sealing purpose is formed correspondingly to the second junction pattern 403 for sealing purpose on the back surface of the crystal vibration plate 4.

As described later, the first sealing member 5, the crystal vibration plate 4 and the second sealing member 6 are stacked in layers, and the circular first junction patterns 51 and 403 for sealing purpose of the first sealing member 5 and of the crystal vibration plate 4 are joined by diffusion bonding. Further, the circular second junction patterns 61 and 404 for sealing purpose of the second sealing member 6 and of the crystal vibration plate 4 are joined by diffusion bonding. Thus, the front and back surfaces of the crystal vibration plate 4 are sealed to each other with the first and second sealing members 5 and 6, and a housing space is formed in which the vibrating portion 41 of the crystal vibration plate 4 is housed.

A package is thus formed in which the vibrating portion 41 is housed in a space formed by three layers of crystal plates; the crystal vibration plate 4 and the first and second sealing members 5 and 6 that are stacked on one another. This package, therefore, may be reduced in thickness (reduced in height), as compared with a crystal vibrator so structured that a crystal vibrating piece is housed in the housing recess of a ceramic container and sealed with a lid member joined to the container.

As illustrated in FIGS. 2 and 3, the crystal vibration plate 4 has five through electrodes; first to fifth through electrodes 411 to 415. These electrodes are formed so as to penetrate through the front and back main surfaces of the crystal vibration plate 4. In these through electrodes 411 to 415, inner wall surfaces of through holes are each coated with a metal film. The first to fourth through electrodes 411 to 414 are formed at four corners of the crystal vibration plate 4 on the outer side of the circular first and second junction patterns 403 and 404 for sealing purpose. The fifth through electrode 415 is formed in the frame portion 43 on the inner side of the circular first and second junction patterns 403 and 404 for sealing purpose at a position close to a short side of the crystal vibration plate 4 rectangular in plan view.

Junction patterns 421 to 424 for connecting purpose are formed at positions around the through electrodes 411 to 414 at four corners on the front surface of the crystal vibration plate 4 on the outer side of the circular first junction pattern 403 for sealing purpose. The through electrodes 411 to 414 are electrically connected to these junction patterns 421 to 424 for connecting purpose.

Junction patterns 431 to 434 for connecting purpose are formed at positions around the through electrodes 411 to 414 at four corners on the back surface of the crystal vibration plate 4 on the outer side of the circular second junction pattern 404 for sealing purpose. The through electrodes 411 to 414 are electrically connected to these junction patterns 431 to 434 for connecting purpose.

As described later, the first sealing member 5 and the second sealing member 6 respectively have first to fourth through electrodes 501 to 504 and first to fourth through electrodes 601 to 604 that are formed correspondingly to the first to fourth through electrodes 411 to 414 of the crystal vibration plate 4 (see FIGS. 5 and 6).

As illustrated in FIG. 2, a junction pattern 425 for connecting purpose is formed around the fifth through electrode 415 on the front surface of the crystal vibration plate 4. The fifth through electrode 415 and the junction pattern 425 for connecting purpose are electrically connected to each other.

As illustrated in FIG. 3, a junction pattern 402 for connecting purpose, which is connected to the extraction electrode 48 extracted from the second driving electrode 46, is formed around the fifth through electrode 415 on the back surface of the crystal vibration plate 4. The fifth through electrode 415 is electrically connected to this junction pattern 402 for connecting purpose and is thus electrically connected to the second driving electrode 46.

On one side of the front surface of the crystal vibration plate 4 in a direction along its long sides across the vibrating portion 41 (lateral direction in FIG. 2), a junction pattern 425 for connecting purpose is formed around the fifth through electrode 415, and a junction pattern 401 for connecting purpose is formed to be continuous to the first extraction electrode 47, as illustrated in FIG. 2. On the other side of the front surface of the crystal vibration plate 4 in the same direction are formed two junction patterns 441 and 442 for connecting purpose.

The junction patterns 425 and 401 for connecting purpose and the junction patterns 441 and 442 for connecting purpose are substantially symmetric with respect to a center line CL in the long-side direction of the crystal vibration plate 4. Also, the junction patterns 425 and 441 for connecting purpose and the junction patterns 401 and 442 for connecting purpose are substantially symmetric with respect to a center line in the short-side direction of the crystal vibration plate 4. Thus, the junction patterns 425 and 401 for connecting purpose and the junction patterns 441 and 442 for connecting purpose are substantially symmetric, respectively, in the long-side direction and in the short-side direction of the crystal vibration plate 4.

Also, the junction patterns 421 to 424 for connecting purpose formed around the through electrodes 411 to 414 at four corners on the front surface of the crystal vibration plate 4 are symmetric, respectively, in the long-side direction and in the short-side direction of the crystal vibration plate 4.

This structural feature; the junction patterns 425 and 401, 441 and 442, 421 to 424 being symmetric or substantially symmetric, respectively, in the long-side direction and in the short-side direction of the crystal vibration plate 4, may allow a pressing force to be equally applied at the time of diffusion bonding.

As in the front surface of the crystal vibration plate 4, the junction pattern 402 for connecting purpose extended to the fifth through electrode 415 is formed on the back surface of the crystal vibration plate 4. The junction pattern 402 for connecting purpose is formed on one side in the long-side direction of the crystal vibration plate 4 across the vibrating portion 41 (lateral direction in FIG. 3). Two junction patterns 451 and 452 for connecting purpose are formed on the other side in the long-side direction of the crystal vibration plate 4. Similarly, the junction pattern 402 for connecting purpose and the junction patterns 451 and 452 for connecting purpose are substantially symmetric in the long-side direction and in the short-side direction of the crystal vibration plate 4.

Also, the junction patterns 431 to 434 for connecting purpose formed around the through electrodes at four corners on the back surface of the crystal vibration plate 4 are symmetric in the long-side direction and in the short-side direction of the crystal vibration plate 4.

The electrodes and junction patterns of the crystal vibration plate 4; first and second driving electrodes 45 and 46, first and second extraction electrodes 47 and 48, first and second junction patterns 403 and 404 for sealing purpose, and junction patterns 401, 402, 421 to 425, 431 to 434, 441, 442, 451 and 452 for connecting purpose, may each consist of, for example, a ground layer including Ti or Cr and an Au layer formed on the ground layer.

Figure 4:
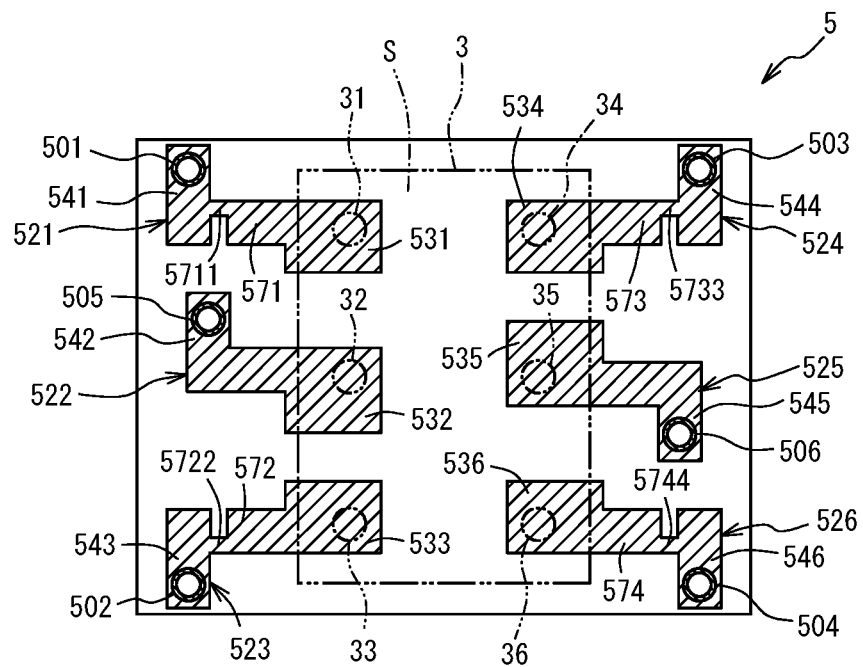
FIG. 4 is a schematic plan view illustrating the side of one main surface of a first sealing member shown in FIG. 1.

FIG. 4 is a schematic plan view illustrating the front-surface side of the first sealing member 5. FIG. 5 is a schematic plan view illustrating the back-surface side the first sealing member 5 seen through from the front-surface side.

The first sealing member 5 is a cuboidal substrate including an AT-cut crystal plate, similarly to the crystal vibration plate 4. As illustrated in FIG. 5, the first sealing member 5 has, on its back surface, a first junction pattern 51 for sealing purpose to be joined for sealing to the first junction pattern 403 for sealing purpose on the front surface of the crystal vibration plate 4. This first junction pattern 51 for sealing purpose is formed in a circular shape along the whole circumference of the first sealing member 5 and substantially along the outer peripheral edge of the first sealing member 5 except its four corners.

The first sealing member 5 has six through electrodes; first to sixth through electrodes 501 to 506, which are formed so as to penetrate through the front and back main surfaces of the first sealing member 5. In these through electrodes 501 to 506, inner wall surfaces of through holes are each coated with a metal film. As with the first to fourth through electrodes 411 to 414 of the crystal vibration plate 4, the first to fourth through electrodes 501 to 504 are formed at four corners of the first sealing member 5 rectangular in plan view. The fifth through electrode 505 is formed, correspondingly to the junction pattern 441 for connecting purpose on the front surface of the crystal vibration plate 4, at a position on the inner side of the circular first junction pattern 51 for sealing purpose close to a short side of the rectangular first sealing member 5. The sixth through electrode 506 is formed, correspondingly to the junction pattern 401 for connecting purpose on the front surface of the crystal vibration plate 4, at a position on the inner side of the circular first junction pattern 51 for sealing purpose close to the other short side of the rectangular first sealing member 5.

As illustrated in FIG. 5, junction patterns 511 to 514 for connecting purpose are formed around the through electrodes 501 to 504 at four corners on the back surface of the first sealing member 5. These through electrodes 501 to 504 are electrically connected, respectively, to the junction patterns 511 to 514 for connecting purpose.

A junction pattern 515 for connecting purpose is formed around the fifth through electrode 505 on the back surface of the first sealing member 5. This fifth through electrode 505 is electrically connected to the junction pattern 515 for connecting purpose. A junction pattern 518 for connecting purpose is formed, correspondingly to the junction pattern 425 for connecting purpose on the front surface of the crystal vibration plate 4, at a position on the opposite side of the junction pattern 515 for connecting purpose in the long-side direction of the first sealing member 5 (lateral direction in FIG. 5). The junction pattern 518 for connecting purpose and the junction pattern 515 for connecting purpose formed around the fifth through electrode 505 are electrically connected to each other via a wiring pattern 519 for connecting purpose. The junction pattern 518 for connecting purpose on the back surface of the first sealing member 5 is, therefore, electrically connected to the fifth through electrode 505 of the first sealing member 5.

As described later, the junction pattern 518 for connecting purpose of the first sealing member 5 is joined by diffusion bonding to the junction pattern 425 for connecting purpose formed around the fifth through electrode 415 on the front surface of the crystal vibration plate 4. The junction pattern 518 for connecting purpose is thus electrically connected to the fifth through electrode 415 of the crystal vibration plate 4. The fifth through electrode 415 of the crystal vibration plate 4 is electrically connected to the second driving electrode 46 formed on the back surface of the crystal vibration plate 4. The junction pattern 518 for connecting purpose of the first sealing member 5 is thus electrically connected to the second driving electrode 46 of the crystal vibration plate 4. The junction pattern 518 for connecting purpose of the first sealing member 5 is electrically connected to the junction pattern 515 for connecting purpose formed around the fifth through electrode 505 via the wiring pattern 519 for connecting purpose. Therefore, the second driving electrode 46 formed on the back surface of the crystal vibration plate 4 is electrically connected to the fifth through electrode 505 of the first sealing member 5 via the fifth through electrode 415 of the crystal vibration plate 4 and the junction patterns 518, 519 and 515 for connecting purpose of the first sealing member 5.

A junction pattern 516 for connecting purpose is formed, correspondingly to the junction pattern 401 for connecting purpose on the front surface of the crystal vibration plate 4, around the sixth through electrode 506 on the back surface of the first sealing member 5. The sixth through electrode 506 is electrically connected to this junction pattern 516 for connecting purpose. On the opposite side of the junction pattern 516 for connecting purpose in the long-side direction of the first sealing member 5 (lateral direction on FIG. 5), a junction pattern 517 for connecting purpose is formed correspondingly to the junction pattern 442 for connecting purpose on the front surface of the crystal vibration plate 4.

As described later, the junction pattern 516 for connecting purpose of the first sealing member 5 is joined by diffusion bonding to the junction pattern 401 for connecting purpose formed on the front surface of the crystal vibration plate 4. The junction pattern 516 for connecting purpose is, therefore, electrically connected to the first driving electrode 45 via the junction pattern 401 for connecting purpose and the first extraction electrode 47. The sixth through electrode 506 of the first sealing member 5 is thus electrically connected to the first driving electrode 45 of the crystal vibration plate 4.

As with the crystal vibration plate 4, the junction patterns 515 to 518 for connecting purpose formed on the back surface of the first sealing member 5 are substantially symmetric in the long-side direction and in the short-side direction of the first sealing member 5 to allow a pressing force to be equally applied at the time of diffusion bonding. The junction patterns 511 to 514 for connecting purpose formed around the through electrodes 501 to 504 at four corners on the back surface of the first sealing member 5 are also symmetric in the long-side direction and in the short-side direction of the first sealing member 5.

The front surface of the first sealing member 5 is a surface to be mounted with the IC3. In FIG. 4 showing the front surface of the first sealing member 5, virtual lines are used to illustrate the rectangular outer shape of the IC3 in plan view mounted to the first sealing member 5 and outer shapes of the first to sixth mounting terminals 31 to 36 of the IC3.

As illustrated in FIG. 4, first to sixth electrodes 521 to 526 for mounting purpose are formed on the front surface of the first sealing member 5. The first to sixth mounting terminals 31 to 36 of the IC3 are respectively connected to these electrodes 521 to 526 for mounting purpose.

In a rectangular mounting region S defined with a virtual line where the IC3 is mounted, the first to sixth electrodes 521 to 526 for mounting purpose have first to sixth terminal junctions 531 to 536 including electrode pads (not illustrated in the drawings) to which the mounting terminals 31 to 36 of the IC3 are connectable. The first to sixth electrodes 521 to 526 for mounting purpose further have first to sixth electrode connectors 541 to 546 electrically connectable to the through electrodes 501, 505, 502, 503, 506 and 504. These electrode connectors 541 to 546 are extending from the first to sixth terminal junctions 531 to 536 in the mounting region S toward the outside of the mounting region S.

As illustrated in FIG. 1, the IC3 is joined, with a metallic member; metal bumps 7 (for example, Au bumps), to the front surface of the first sealing member 5 by the FCB (flip-chip bonding). Instead of the metal bumps 7, metal plating or metal paste may be used for bonding.

An interval between the IC3 and the first sealing member 5 is filled with a sealing resin; underfill resin 8, to protect the acting surface of the IC3 and to ensure an adequate mechanical bonding strength.

As with the first and second junction patterns 403 and 404 for sealing purpose of the crystal vibration plate 4, the respective patterns and electrodes of the first sealing member 5; first junction pattern 51 for sealing purpose, junction patterns 511 to 518 for connecting purpose, wiring pattern 519 for connecting purpose, and first to sixth electrodes 521 to 526 for mounting purpose, may each consist of, for example, a ground layer including Ti or Cr and an Au layer formed on the ground layer.

The other technical aspects of the front surface of the first sealing member 5 will be described later.

Figure 7:
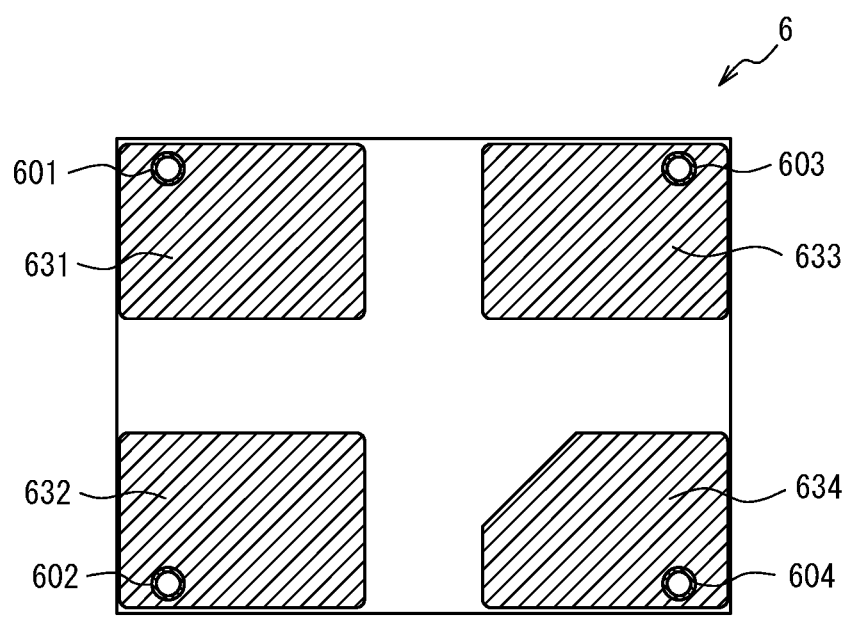
FIG. 7 is a schematic plan view illustrating the side of the other main surface of the second sealing member seen through from the side of the one main surface of the second sealing member shown in FIG. 1.

FIG. 6 is a schematic plan view illustrating the front-surface side of the second sealing member 6. FIG. 7 is a schematic plan view illustrating the back-surface side of the second sealing member 6 seen through from the front-surface side.

The second sealing member 6 is a cuboidal substrate, including an AT-cut crystal plate, like the crystal vibration plate 4 and the first sealing member 5.

As illustrated in FIG. 6, the second sealing member 6 has, on its front surface, a second junction pattern 61 for sealing purpose to be joined for sealing to the second junction pattern 404 for sealing purpose on the back surface of the crystal vibration plate 4. This second junction pattern 61 for sealing purpose is formed in a circular shape along the whole circumference of the second sealing member 6 and substantially along the outer peripheral edge of the second sealing member 6 except its four corners.

The second sealing member 6 has four through electrodes; first to fourth through electrodes 601 to 604, which are formed so as to penetrate through the front and back main surfaces of the second sealing member 6. In these through electrodes 601 to 604, inner wall surfaces of through holes are each coated with a metal film. Like the first to fourth through electrodes 411 to 414 of the crystal vibration plate 4, the first to fourth through electrodes 601 to 604 are formed at four corners of the rectangular shape in plan view of the second sealing member 6. As illustrated in FIG. 6, junction patterns 611 to 614 for connecting purpose are formed around the through electrodes 601 to 604 at four corners on the front surface of the second sealing member 6. The through electrodes 601 to 604 are electrically connected to the junction patterns 611 to 614 for connecting purpose.

At positions close to short sides of the second sealing member 6 on the inner side of the circular second junction pattern 61 for sealing purpose, four junction patterns in total; two junction patterns 621 and 622 for connecting purpose and two junction patterns 623 and 624 for connecting purpose, are formed correspondingly to the junction patterns 451, 452 and 402 for connecting purpose on the back surface of the crystal vibration plate 4.

To allow a pressing force to be equally applied at the time of diffusion bonding, the junction patterns 621, 622, 623 and 624 for connecting purpose on the front surface of the second sealing member 6 and the junction patterns 611 to 614 for connecting purpose formed at four corners on the front surface are, in the same manner as with the crystal vibration plate 4, substantially symmetric in the long-side direction and in the short-side direction of the second sealing member 6.

As illustrated in FIG. 7, the second sealing member 6 has, on its back surface, four terminals; first to fourth terminals 631 to 634 for external connection, which are used to mount the temperature-compensated crystal oscillator 1 to an external circuit board.

In the illustrated example, the first terminal 631 for external connection is a terminal to be connected to a power supply. The second terminal 632 for external connection is a terminal for oscillation output. The third terminal 633 for external connection is a terminal for control voltage input. The fourth terminal 634 for external connection is a terminal for grounding.

The first to fourth terminals 631 to 634 for external connection are formed at four corners of the second sealing member 6 rectangular in plan view. The first to fourth through electrodes 601 to 604 are formed in the corner regions where the first to fourth terminals 631 to 634 for external connection are formed. These through electrodes 601 to 604 are thus electrically connected to the respective terminals 631 to 634 for external connection.

As with the first and second junction patterns 403 and 404 for sealing purpose of the crystal vibration plate 4, the respective patterns and terminals of the second sealing member 6; the second junction pattern 61 for sealing purpose, the junction patterns 611 to 614 and 621 to 624 for connecting purpose and the first to fourth terminals 631 to 634 for external connection, may each consist of, for example, a ground layer including Ti or Cr and an Au layer formed on the ground layer.

Unlike the known art in which joining materials, such as adhesives, may be used, no exclusive joining material is used to join the crystal vibrator 2 to the target materials. The crystal vibrator 2 described in this embodiment is produced in the form of a sandwich-like package, as illustrated in FIG. 1, in which the crystal vibration plate 4 and the first sealing member 5 are joined by diffusion bonding, with the first junction patterns 403 and 51 for sealing purpose being stacked on each other, and the crystal vibration plate 4 and the second sealing member 6 are joined by diffusion bonding, with the second junction patterns 404 and 61 for sealing purpose being stacked on each other. Then, the housing space containing the vibrating portion 41 of the crystal vibration plate 4 is air-tightly sealed with the sealing members 5 and 6.

In this instance, the first junction pattern 403 for sealing purpose of the crystal vibration plate 4 and the first junction pattern 51 for sealing purpose of the first sealing member 5 are combined by diffusion bonding into a joining material, and the second junction pattern 404 for sealing purpose of the crystal vibration plate 4 and the second junction pattern 61 for sealing purpose of the second sealing member 6 are combined by diffusion bonding into a joining material.

By performing the diffusion bonding under pressure, bonding strengths of the respective joining materials may be successfully improved.

During the diffusion bonding, the junction patterns for connecting purpose described earlier are stacked on and joined to each other by diffusion bonding and further joined firmly to each other with the joining materials generated as the result of diffusion bonding.

Specifically, the junction patterns 421 to 424 for connecting purpose formed at four corners on the front surface of the crystal vibration plate 4 are joined by diffusion bonding to the junction patterns 511 to 514 for connecting purpose formed at four corners on the back surface of the first sealing member 5. The junction patterns 441 and 442 for connecting purpose formed at positions on the front surface of the crystal vibration plate 4 close to a short side thereof on the inner side of the circular first junction pattern 403 for sealing purpose are joined by diffusion bonding to the junction patterns 515 and 517 for connecting purpose on the back surface of the first sealing member 5. The junction patterns 425 and 401 for connecting purpose formed at positions on the front surface of the crystal vibration plate 4 close to the other short side thereof on the inner side of the circular first junction pattern 403 for sealing purpose are joined by diffusion bonding to the junction patterns 518 and 516 for connecting purpose on the back surface of the first sealing member 5.

Further, the junction patterns 431 to 434 for connecting purpose formed at four corners on the back surface of the crystal vibration plate 4 are joined by diffusion bonding to the junction patterns 611 to 614 on the front surface of the second sealing member 6. The junction patterns 451 and 452 for connecting purpose formed at positions on the back surface of the crystal vibration plate 4 close to a short side thereof on the inner side of the circular second junction pattern 404 for sealing purpose are joined by diffusion bonding to the junction patterns 621 and 622 for connecting purpose on the front surface of the second sealing member 6. The junction pattern 402 for connecting purpose at a position on the back surface of the crystal vibration plate 4 close to the other short side thereof on the inner side of the circular second junction pattern 404 for sealing purpose are joined by diffusion bonding to the junction patterns 623 and 624 for connecting purpose on the front surface of the second sealing member 6.

The junction patterns 611 to 614 for connecting purpose on the front surface of the second sealing member 6 and the junction patterns 431 to 434 for connecting purpose on the back surface of the crystal vibration plate 4 are combined into joining materials by the diffusion bonding described above. Then, the first to fourth through electrodes 601 to 604, which are electrically connected to the first to fourth terminals 631 to 634 for external connection on the back surface of the second sealing member 6, are electrically connected, with these joining materials, to the first to fourth through electrodes 411 to 414 of the crystal vibration plate 4.

The junction patterns 421 to 424 for connecting purpose formed around the through electrodes 411 to 414 on the front surface of the crystal vibration plate 4 and the junction patterns 511 to 514 for connecting purpose on the back surface of the first sealing member 5 are combined into joining materials by the diffusion bonding described above. The, the first to fourth through electrodes 411 to 414 of the crystal vibration plate 4 are electrically connected, with these joining materials, to the first to fourth through electrodes 501 to 504 of the first sealing member 5.

Therefore, the first to fourth terminals 631 to 634 for external connection on the back surface of the second sealing member 6 are electrically connected, respectively, to the first to fourth through electrodes 411 to 414 of the crystal vibration plate 4 via the first to fourth through electrodes 601 to 604 of the second sealing member 6. These first to fourth terminals 631 to 634 for external connection are further electrically connected, respectively, to the first to fourth through electrodes 501 to 504 of the first sealing member 5 via the first to fourth through electrodes 411 to 414.

As illustrated in FIG. 4, the first to fourth through electrodes 501 to 504 of the first sealing member 5 are electrically connected, respectively, to the electrode connectors 541, 543, 544 and 546 of the first, third, fourth and sixth electrodes 521, 523, 524 and 526 for mounting purpose on the front surface of the first sealing member 5. Therefore, the first to fourth terminals 631 and 634 for external connection of the second sealing member 6 are electrically connected, respectively, to the electrode connectors 541, 543, 544 and 546 of the first, third, fourth and sixth electrodes 521, 523, 524 and 546 for mounting purpose on the front surface of the first sealing member 5.

The junction pattern 401 for connecting purpose, which is connected to the first driving electrode 45 on the front surface of the crystal vibration plate 4 illustrated in FIG. 2 via the first extraction electrode 47, is electrically connected to the sixth through electrode 506 of the first sealing member 5 with the joining material generated by the diffusion bonding of the junction pattern 516 for connecting purpose formed around the sixth through electrode 506 on the back surface of the first sealing member 5 illustrated in FIG. 5. As illustrated in FIG. 4, the sixth through electrode 506 of the first sealing member 5 is electrically connected to the fifth electrode connector 545 of the fifth electrode 525 for mounting purpose on the front surface of the first sealing member 5.

The first driving electrode 45 of the crystal vibration plate 4 is, therefore, electrically connected to the fifth electrode connector 545 of the fifth electrode 525 for mounting purpose of the first sealing member 5 via the sixth through electrode 506 of the first sealing member 5.

The fifth through electrode 415 electrically connected to the second driving electrode 46 on the back surface of the crystal vibration plate 4 illustrated in FIG. 3 via the second extraction electrode 48 and the junction pattern 402 for connecting purpose is also electrically connected to the junction pattern 425 for connecting purpose on the front surface of the crystal vibration plate 4 illustrated in FIG. 2. The fifth through electrode 415 of the crystal vibration plate 4 is electrically connected, with the joining material generated by the diffusion bonding of the junction pattern 425 for connecting purpose of the crystal vibration plate 4 and the junction pattern 518 for connecting purpose on the back surface of the first sealing member 5 illustrated in FIG. 5, to the junction pattern 518 for connecting purpose on the back surface of the first sealing member 5. The junction pattern 518 for connecting purpose on the back surface of the first sealing member 5 is connected to the junction pattern 515 for connecting purpose formed around the fifth through electrode 505 via the wiring pattern 519 for connecting purpose. The junction pattern 515 for connecting purpose on the back surface of the first sealing member 5 is electrically connected to the fifth through electrode 505. As illustrated in FIG. 4, the fifth through electrode 505 is electrically connected to the second electrode connector 542 of the second electrode 522 for mounting purpose on the front surface of the first sealing member 5.

The second driving electrode 46 on the back surface of the crystal vibration plate 4 is, therefore, electrically connected to the second electrode connector 542 of the second electrode 522 for mounting purpose on the front surface of the first sealing member 5 via the fifth through electrode 415 of the crystal vibration plate 4, junction patterns 518, 519 and 515 for connecting purpose on the back surface of the first sealing member 5, and the fifth through electrode 505 of the first sealing member 5.

In the surface-mounted, temperature-compensated crystal oscillator 1 thus characterized, the first to fourth terminals 631 to 634 for external connection of the second sealing member 6 on the back-surface side of the crystal vibrator 2 illustrated in FIG. 1 are mounted and joined with a bonding material, such as solder, to an external circuit board not illustrated in the drawing.

When an external circuit board mounted with electronic components; heat source, (for example, power transistors) is turned on and supplied with electric current, the electronic components start to generate heat. Then, heat generated then may be conducted to the first to fourth terminals 631 to 634 for external connection of the surface-mounted, temperature-compensated crystal oscillator 1 mounted to the external circuit board.

As described earlier, the IC3 is directly connected to the first to fourth terminals for external connection 631 to 634 via the first to fourth through electrodes 601 to 604, 411 to 414 and 501 to 504 constituting in part the internal wiring. On the other hand, the first and second driving electrodes 45 and 46 of the crystal vibrator 2 are connected to the IC3 and are thus not directly connected to the first to fourth terminals for external connection 631 to 634 on the back surface of the second sealing member 6.

Therefore, any heat generated from the electronic components; heat source, mounted to the circuit board may be conducted to the temperature-compensated crystal oscillator 1 and further conducted rapidly to the IC3 via the first to fourth through electrodes 601 to 604, 411 to 414 and 501 to 504 and the first to fourth terminals for external connection 631 to 634 that excel in thermal conductivity. Thus, the temperature rise of the IC3 may exhibit a sharper gradient than that of the crystal vibrator 2, resulting in greater temperature differences between the crystal vibrator 2 and the IC3. Then, accurate temperature compensation may be difficult to perform, leading to frequency variations, i.e., generally called frequency drift, until the state of thermal equilibrium is reached between the crystal vibrator 2 and the IC3 with less or no temperature difference between them.

This frequency drift may also occur when the electronic components; heat source, mounted to the external circuit board are electrically turned off. When the electronic components mounted to the external circuit board are electrically turned off, heat generated from the electronic components may no longer be conducted to the temperature-compensated crystal oscillator 1, causing the temperature of the temperature-compensated crystal oscillator 1 to drop to lower degrees. At the time, heat from the IC3 may be rapidly conducted to the first to fourth terminals 631 to 634 for external connection via the first to fourth through electrodes 601 to 604, 411 to 414 and 501 to 504 having better thermal conductivity than the crystal vibrator 2, and the heat conducted to these electrodes is then radiated. Thus, the temperature drop of the IC3 may exhibit a sharper gradient than that of the crystal vibrator 2. This may invite greater temperature differences between the crystal vibrator 2 and the IC3, leading to the frequency drift.

In order to prevent the occurrence of such an unfavorable event; frequency drift, this embodiment provides the following technical features for control of possible temperature differences generated between the IC3 and the crystal vibrator 2 when the electronic components; heat source, mounted to the external circuit board are electrically turned on and off, so that the state of thermal equilibrium is quickly reached between these devices.

In this embodiment, the gradients of temperature rise and drop of the IC3 when the electronic components; heat source; mounted to the external circuit board are electrically turned on and off may be rendered as moderate as possible to minimize possible temperature differences between the IC3 and the crystal vibrator 2.

Specifically, among the first to sixth electrodes 521 to 526 for mounting purpose on the front surface of the first sealing member 5 illustrated in FIG. 4, the first, third, fourth and sixth electrodes 521, 523, 524 and 526 for mounting purpose, except for two paired second and fifth electrodes 522 and 525 for mounting purpose that are connected to the first and second driving electrodes 45 and 46 of the crystal vibration plate 4, respectively have first to fourth wiring patterns 571 to 574. The first to fourth wiring patterns 571 to 574 provide electrical connection between the first, third, fourth and sixth electrode connectors 541, 543, 544 and 546 formed around the first to fourth through electrodes 501 to 504 and the first, third, fourth and sixth terminal junctions 531, 533, 534 and 536 to which the first, third, fourth and sixth mounting terminals 31, 33, 34 and 36 of the IC3 are joined. The first to fourth wiring patterns 571 to 574 respectively have constricted portions 5711, 5722, 5733 and 5744 smaller in wiring width than the other portions. The constricted portions 5711, 5722, 5733 and 5744 are formed by cutting the wiring patterns 571 to 574 in part on one side into a rectangular shape.

For example, the constricted portions 5711, 5722, 5733 and 5744 may have a wiring width smaller than or equal to 100 μm or preferably smaller than or equal to 40 μm. In this embodiment, the wiring widths of these constricted portions are smaller than or equal to 40 μm.

A simulation test was performed to discuss how the rate of thermal conductivity changes with different wiring lengths and widths, the result of which is hereinafter described.

Two blocks connected to each other with a wiring were used. Then, this simulation test calculated the amounts of time required for the temperature of an outer surface of one of the blocks to reach 0.9° C. with different wiring lengths and widths when the temperature of an outer surface of the other block was fixed to 1° C.

Figure 8:
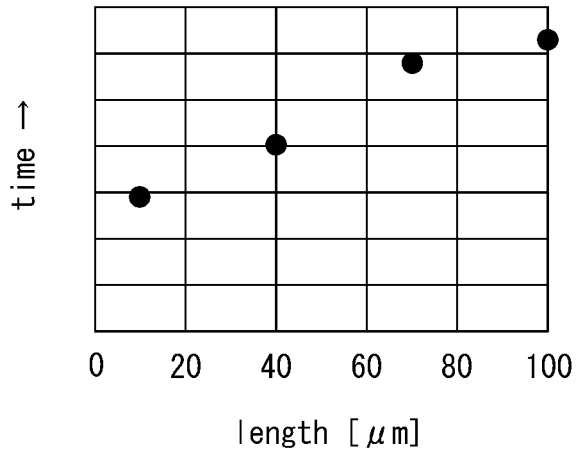
FIG. 8 is a graphical illustration of a simulation result that represents a relationship between wiring length and heat conduction time.
Figure 9:
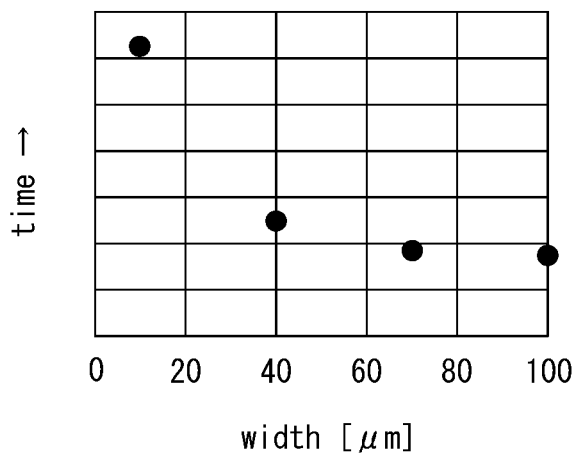
FIG. 9 is a graphical illustration of a simulation result that represents a relationship between wiring width and heat conduction time.

FIG. 8 is a graph showing the amounts of time required for the outer surface temperature of one of the blocks to reach 0.9° C. with different wiring lengths, in which the lateral axis represents the wiring length, and the vertical axis represents the time. FIG. 9 is a graph showing the amounts of time required for the outer surface temperature of one of the blocks to reach 0.9° C. with different wiring widths, in which the lateral axis represents the wiring width, and the vertical axis represents the time.

These graphs teach that it takes more time for the outer surface temperature of one of the blocks to reach 0.9° C. as the wiring that interconnects the two blocks is greater in length and smaller in width.

As illustrated in FIG. 9, there is not much difference among the amounts of time calculated with the wiring widths of approximately 40 μm or more, whereas the amounts of time suddenly and rapidly increase to approximately three times greater with the wiring widths of approximately 40 μm or less.

In this embodiment, the first to fourth wiring patterns 571 to 574 provide electrical connection between the first, third, fourth and sixth electrode connectors 541, 543, 544 and 546 formed around the first to fourth through electrodes 501 to 504 and the first, third, fourth and sixth terminal junctions 531, 533, 534 and 536 to which the first, third, fourth and sixth mounting terminals 31, 33, 34 and 36 of the IC3 are joined, and these wiring patterns 571 to 574 respectively have constricted portions 5711, 5722, 5733 and 5744 smaller in wiring width than the other portions. These constricted portions 5711, 5722, 5733 and 5744 may serve to prevent the conduction of heat between the first to fourth through electrodes 501 to 504 and first, third, fourth and sixth terminal junctions 531, 533, 534 and 536 to which the first, third, fourth and sixth mounting terminals 31, 33, 34 and 36 of the IC3 are joined.

When the electronic components; heat source, of the external circuit board mounted with the temperature-compensated crystal oscillator 1 are electrically turned on, the electronic components start to generate heat. Then, heat generated then may be conducted to the temperature-compensated crystal oscillator 1 and further conducted to the IC3 via the first to fourth terminals for external connection 631 to 634, the first to fourth through electrodes 601 to 604, 411 to 414 and 501 to 504, and the first to fourth wiring patterns 571 to 574. In this instance, the conduction of heat to the IC3 may be prevented by the constricted portions 5711, 5722, 5733 and 5744 of the first to fourth wiring patterns 571 to 574. As a result, the temperature rise gradient of the IC3 may become moderate, allowing effective control of possible temperature differences between the IC3 and the crystal vibrator 2. Thus, the state of thermal equilibrium may be successfully reached between the IC3 and the crystal vibrator 2, and the frequency drift may be unlikely to occur.

When the electronic components; heat source; mounted to the external circuit board are electrically turned off, heat generated from the electronic components may no longer be conducted to the temperature-compensated crystal oscillator 1, causing the temperature of the temperature-compensated crystal oscillator 1 to drop to lower degrees. At the time, heat from the IC3 may be rapidly conducted from its first, third, fourth and sixth mounting terminals 31, 33, 34 and 36 of the IC3 to the first to fourth terminals 631 to 634 for external connection via the first to fourth wiring patterns 571 to 574 and the first to fourth through electrodes 501 to 504, 411 to 414 and 601 to 604, and the heat conducted to these terminals is then radiated. In this instance, the constricted portions 5711, 5722, 5733 and 5744 of the first to fourth wiring patterns 571 to 574 may successfully prevent the conduction of heat from IC3 to the first to fourth through electrodes 501 to 504. Thus, the temperature drop gradient of the IC3 may become moderate, allowing effective control of possible temperature differences between the IC3 and the crystal vibrator 2. As a result, the state of thermal equilibrium may be quickly reached between the crystal vibration plate 4 and the IC3, and the frequency drift may be unlikely to occur.

In this embodiment, all of the wiring patterns 571 to 574 have the constricted portions; constricted portions 5711, 5722, 5733 and 5744. In one embodiment of the present invention, at least one of these wiring patterns, instead of all of them, may be provided with a constricted portion.

Second Embodiment

Figure 10:
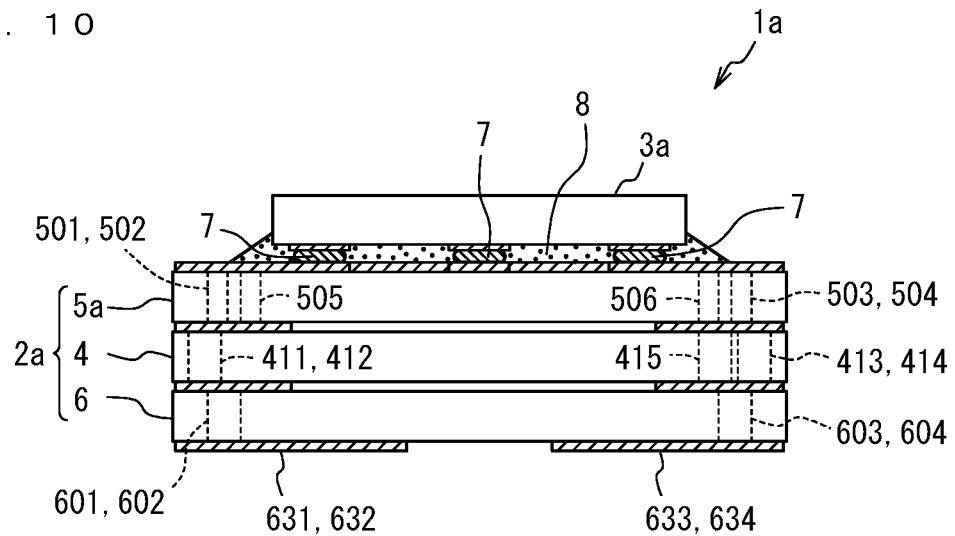
FIG. 10 is a schematic structural view of a temperature-compensated crystal oscillator according to another embodiment of the present invention.
Figure 11:
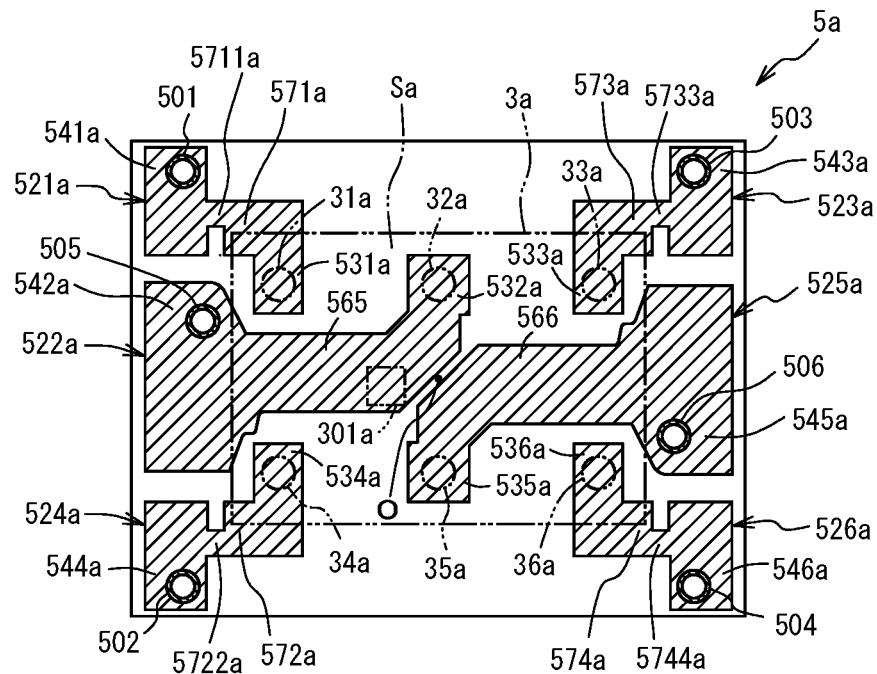
FIG. 11 is a schematic plan view illustrating the side of one main surface of a first sealing member according to the embodiment shown in FIG. 10.

FIG. 10 is a schematic structural view of a temperature-compensated crystal oscillator according to another embodiment of the present invention. This drawing is illustrated correspondingly to FIG. 1. FIG. 11 is a schematic plan view illustrating the front-surface side of a first sealing member 5a in a crystal vibrator 2a provided in a temperature-compensated crystal oscillator 1a according to the embodiment shown in FIG. 10. This drawing is illustrated correspondingly to FIG. 4. In these drawings, the same reference signs as in the first embodiment or corresponding reference signs are appended to the same structural elements as described in the first embodiment or corresponding structural elements.

In this embodiment, any technical aspects but the electrode patterns on the front surface of the first sealing member 5a and an IC3a, i.e., the back-surface side of the first sealing member 5a, the crystal vibration plate 4 and the second sealing member 6, are substantially the same as described in the first embodiment illustrated in FIGS. 2, 3 and 5 to 7. These like components and features, therefore, will not be described again in this embodiment.

In this embodiment, a direction in which the IC3a is mounted relative to the first sealing member 5a differs from what is described in the first embodiment, and electrode patterns of the first sealing member 5a accordingly differ from what is described in the first embodiment. In the first embodiment, the IC3 is mounted so that its long-side direction is orthogonal to the long-side direction of the first sealing member 5, as illustrated in FIG. 4. On the other hand, the IC3a is mounted in this embodiment so that its long-side direction is parallel to the long-side direction of the first sealing member 5a, as illustrated in FIG. 11.

In FIG. 11 illustrating the front-surface side of the first sealing member 5a, virtual lines are used to illustrate the rectangular outer shape in plan view of the IC3a mounted to the first sealing member 5a, and outer shapes of first to sixth mounting terminals 31a to 36a and a temperature sensor 301a.

As illustrated in FIG. 11, the first sealing member 5a has, on its front surface, first to sixth electrodes 521a to 526a for mounting purpose. The first to sixth mounting terminals 31a to 36a of the IC3a are respectively connected to these electrodes 521a to 526a for mounting purpose.

In a rectangular mounting region Sa defined with a virtual line where the IC3a is mounted, the first to sixth electrodes 521a to 526a for mounting purpose have first to sixth terminal junctions 531a to 536a including electrode pads (not illustrated in the drawings) to which the mounting terminals 31a to 36a of the IC3a are connectable. The first to sixth electrodes 521a to 526a for mounting purpose further have first to sixth electrode connectors 541a to 546a electrically connectable to the through electrodes, 501, 505, 503, 502, 506 and 504. These electrode connectors 541a to 546a are extending from the first to sixth terminal junctions 531a to 536a in the mounting region Sa toward the outside of the mounting region Sa.

Of the first to sixth electrodes 521a to 526a for mounting purpose on the front surface of the first sealing member 5a, the first, fourth, third and sixth electrodes 521a, 524a, 523a and 526a for mounting purpose, except for two paired second and fifth electrodes 522a and 525a for mounting purpose that are connected to the first and second driving electrodes 45 and 46 of the crystal vibration plate 4, respectively have first to fourth wiring patterns 571a to 574a. The first to fourth wiring patterns 571a to 574a provide electrical connection between the first, fourth, third and sixth electrode connectors 541a, 544a, 543a and 546a around the first to fourth through electrodes 501 to 504 and the first, fourth, third and sixth terminal junctions 531a, 534a, 533a and 536a to which the first, fourth, third and sixth mounting terminals 31a, 34a, 33a and 36a of the IC3a are joined. These wiring patterns 571a to 574a respectively have constricted portions 5711a, 5722a, 5733a and 5744a smaller in wiring width than the other portions.

Thus, the first, fourth, third and sixth electrode connectors 541a, 544a, 543a and 546a around the first to fourth through electrodes 501 to 504 of the first sealing member 5a are electrically connected, via the first to fourth wiring patterns 571a to 574a, to the first, fourth, third and sixth terminal junctions 531a, 534a, 533a and 536a to which the first, fourth, third and sixth mounting terminals 31a, 34a, 33a and 36a of the IC3a are joined, and these wiring patterns 571a to 574a that thus provide electrical connection between these electrode connectors and terminal junctions respectively have the constricted portions 5711a, 5722a, 5733a and 5744a smaller in wiring width than the other portions. These constricted portions 5711a, 5722a, 5733a and 5744a may effectively prevent the conduction of heat between the first to fourth through electrodes 501 to 504 and the first, fourth, third and sixth terminal junctions 531a, 534a, 533a and 536a to which the first, fourth, third and sixth mounting terminals 31a, 34a, 33a and 36a of the IC3a are joined.

In this manner, the temperature rise gradient of the IC3a may become moderate when the electronic components; heat source, of the external circuit board mounted with the temperature-compensated crystal oscillator 1a are electrically turned on. Further advantageously, the temperature drop gradient of the IC3a may also become moderate when the electronic components; heat source, of the external circuit board are electrically turned off. Thus, possible temperature differences between the IC3a and the crystal vibrator 2a may be controlled, and the state of thermal equilibrium may be quickly reached between these devices. As a result, the frequency drift may be unlikely to occur.

In this embodiment, the sixth through electrode 506 of the first sealing member 5a electrically connected to the first driving electrode 45 of the crystal vibration plate 4 is electrically connected to the fifth electrode connector 545a of the fifth electrode 525a for mounting purpose, similarly to the first embodiment. The first driving electrode 45 of the crystal vibration plate 4, therefore, is electrically connected to the fifth electrode connector 545a of the fifth electrode 525a for mounting purpose of the first sealing member 5a via the sixth through electrode 506 of the first sealing member 5a.

Further, the fifth through electrode 505 of the first sealing member 5a electrically connected to the second driving electrode 46 of the crystal vibration plate 4 is electrically connected to the second electrode connector 542a of the second electrode 522a for mounting purpose, similarly to the first embodiment. The second driving electrode 46 on the back surface of the crystal vibration plate 4, therefore, is electrically connected to the second electrode connector 542a of the second electrode 522a for mounting purpose on the front surface of the first sealing member 5a via the fifth through electrode 505 of the first sealing member 5a.

In this embodiment, the following technical features are provided to allow the state of thermal equilibrium to be quickly reached between the IC3a and the crystal vibrator 2 without any temperature difference therebetween even when the IC3a is heated to higher temperatures than the crystal vibrator 2.

As illustrated in FIG. 11, the first to sixth mounting terminals 31a to 36a of the IC3a are disposed at positions close to the outer circumference of the IC3a rectangular in plan view. Specifically, the first to sixth mounting terminals 31a to 36a are disposed at positions close to a respective one of long sides; a pair of opposing sides in two pairs of opposing sides of the rectangular shape, and are arranged in two rows along the long sides. The one of two pairs of opposing sides may be "short sides" instead of the "long sides".

In this embodiment, of the first to sixth electrodes 521a to 526a for mounting purpose formed on the front surface of the first sealing member 5a, the second and fifth electrodes 522a and 525a that are paired and connected to the driving electrodes 46 and 45 of the crystal vibration plate 4 respectively have a fifth wiring pattern 565 and a sixth wiring pattern 566. The fifth wiring pattern 565 and the sixth wiring pattern 566 are wiring patterns for driving electrode that are extending inward in the mounting region Sa rectangular in plan view where the IC3a is mounted. The wiring patterns 565 and 565 are formed in a large width, so that areas of these wiring patterns facing the IC3a in the mounting region Sa are adequately large.

In the rectangular mounting region Sa, the fifth and sixth wiring patterns 565 and 566 are extending in the long-side direction of the IC3a (lateral direction on FIG. 11) between the first to third mounting terminals 31a to 33a and the fourth to six mounting terminals 34a to 36a of the IC3a that are arranged in two rows. The fifth and sixth wiring patterns 565 and 566 are then each diagonally bent at a near-center position and extending toward the second and fifth mounting terminals 32a and 35a. The fifth wiring pattern 565 is extending so as to exactly overlap with a rectangular region of projection where the temperature sensor 301a embedded in the IC3a is projected in the mounting region Sa.

In the mounting region Sa where the IC3a is mounted, the fifth and sixth wiring patterns 565 and 566 large in width of the paired second and fifth electrodes 522a and 525a that are respectively connected to the driving electrodes 46 and 45 of the crystal vibration plate 4 are formed in a manner that these wiring patterns face the IC3a.

In case the temperature of the IC3a reaches higher degrees than that of the crystal vibrator 2a, resulting in temperature differences between the IC3a and the crystal vibrator 2a, heat radiated from the IC3a heats the fifth and sixth wiring patterns 565 and 566 that are disposed immediately below the IC3a and are facing the IC3.

The fifth and sixth wiring patterns 565 and 566 are extending from the electrode connectors 542a and 545a of the second and fifth electrodes 522a and 525a for mounting purpose. The electrode connectors 542a and 545a are electrically connected to the fifth and sixth through electrodes 505 and 506. The fifth through electrode 505 is connected to the second driving electrode 46 on the back surface of the crystal vibration plate 4, while the sixth through electrode 506 is connected to the first driving electrode 45 on the front surface of the crystal vibration plate 4.

The fifth and sixth wiring patterns 565 and 566 are thus respectively connected to the driving electrodes 46 and 45 of the crystal vibration plate 4. When heat is radiated from the heated IC3a and the wiring patterns 565 and 566 are thereby heated, therefore, heat radiated from the heated wiring patterns 565 and 566 is conducted to the driving electrodes 46 and 45 of the crystal vibration plate 4 and heat these driving electrodes.

Then, heat is radiated from the IC3a heated to higher temperature degrees than that of the crystal vibrator 2a, and the IC3a cools down to lower temperature degrees. On the other hand, the crystal vibrator 2a is exposed to heat conducted from the second wiring pattern 562 and the fifth wiring pattern 565 heated by the heat radiation from the IC3a. This may effectively control possible temperature differences between the IC3a and the crystal vibrator 2a, allowing the state of thermal equilibrium to be quickly reached between these devices.

Any difference between the temperature of the crystal oscillator 2 and the temperature detected by the temperature sensor 301 of the IC3 may possibly invite frequency variations. Such an unfavorable event, however, may be effectively controlled, and accurate temperature compensation may be thus successfully performed.

In the second electrode 522a for mounting purpose having the fifth wiring pattern 565 and the fifth electrode 525a for mounting purpose having the sixth wiring pattern 566 according to this embodiment, their patterns are formed to be point-symmetric about a central position O of the mounting region Sa rectangular in plan view. Thus, the fifth wiring pattern 565 and the sixth wiring pattern 566 may be efficiently heated by being exposed to the heat radiated from the heated IC3a in a balanced manner.

This embodiment may be particularly advantageous in that the fifth wiring pattern 565 is formed so as to entirely include the region of projection of the temperature sensor 301 embedded in the IC3a. Therefore, the fifth wiring pattern 565 immediately below and facing the temperature sensor 301a may be heated by heat radiated from a part of the IC3a where this temperature sensor is disposed, and heat from the fifth wiring pattern 565 thus heated may be conducted to the crystal vibration plate 4 of the crystal vibrator 2a. As a result, the state of thermal equilibrium may be quickly reached between the crystal vibration plate 4 and a part of the IC3a where the temperature sensor 301a is disposed, and accurate temperature compensation may be successfully performed.

Any other structural and technical features and effects of this embodiment are similar to what is described in the first embodiment.

Figure 12:
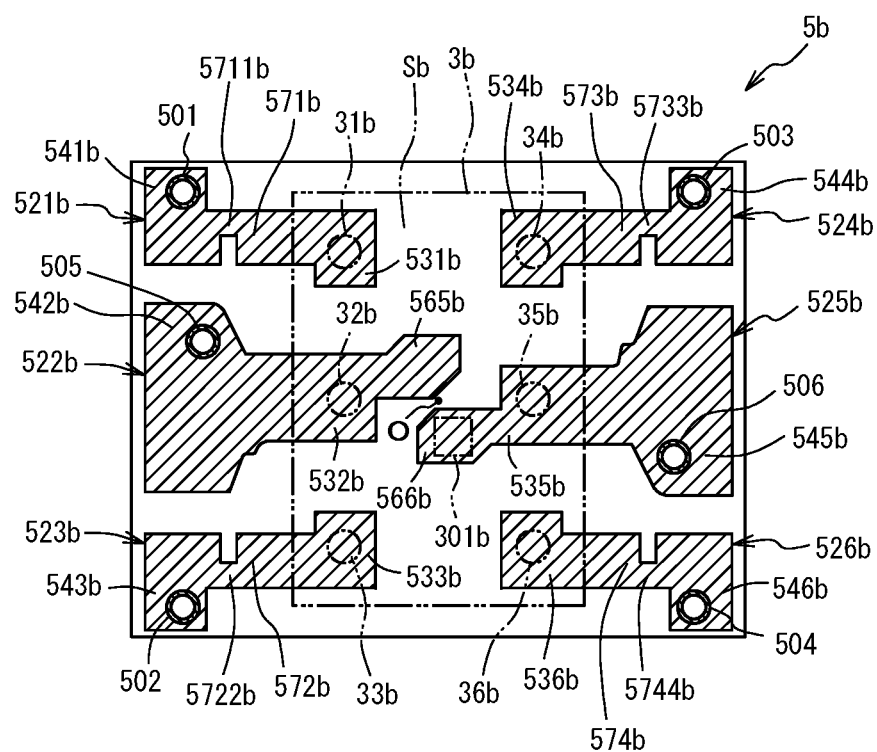
FIG. 12 is a schematic plan view illustrating the side of one main surface of a first sealing member according to yet another embodiment of the present invention.

FIG. 12 is a schematic plan view illustrating the front-surface side of a first sealing member 5b in a crystal vibrator of a temperature-compensated crystal oscillator according to yet another embodiment of the present invention. This drawing is illustrated correspondingly to FIG. 11.

In this embodiment, any technical aspects but the electrode patterns on the front surface of the first sealing member 5b and an IC3b, i.e., the back-surface side of the first sealing member 5b, the crystal vibration plate 4 and the second sealing member 6, are substantially the same as described in the embodiment illustrated in FIGS. 10 and 11. These like components and features, therefore, will not be described again in this embodiment.

In this embodiment, a direction in which the IC3b is mounted relative to the first sealing member 5b differs from what is described in the embodiment illustrated in FIG. 11, and electrode patterns of the first sealing member 5b are accordingly formed differently from what is described in the earlier embodiment. In the earlier embodiment, the IC3a is mounted so that its long-side direction is parallel to the long-side direction of the first sealing member 5a, as illustrated in FIG. 11. On the other hand, the IC3b is mounted in this embodiment so that its long-side direction is orthogonal to the long-side direction of the first sealing member 5b, as illustrated in FIG. 12.

As illustrated in FIG. 11, the first sealing member 5b has, on its front surface, first to sixth electrodes 521b to 526b for mounting purpose. The first to sixth mounting terminals 31b to 36b of the IC3b are respectively connected to the first to sixth electrodes 521b to 526b for mounting purpose correspondingly to how these mounting terminals 31b to 36b are arranged.

In a rectangular mounting region Sb defined with a virtual line where the IC3b is mounted, the first to sixth electrodes 521b to 526b for mounting purpose have first to sixth terminal junctions 531b to 536b including electrode pads (not illustrated in the drawings) to which the mounting terminals 31b to 36b of the IC3b are connectable. The first to sixth electrodes 521b to 526b for mounting purpose further have first to sixth electrode connectors 541b to 546b electrically connectable to the through electrode 501, 505, 502, 503, 506 and 504. These electrode connectors 541b to 546b are extending from the first to sixth terminal junctions 531b to 536b in the mounting region Sb toward the outside of the mounting region Sb.

Among the first to sixth electrodes 521b to 526b for mounting purpose on the front surface of the first sealing member 5b, the first, third, fourth and sixth electrodes 521b, 523b, 524b and 526b for mounting purpose, except for the second and fifth electrodes 522b and 525b for mounting purpose that are paired and connected to the first and second driving electrodes 45 and 46 of the crystal vibration plate 4, respectively have first to fourth wiring patterns 571b to 574b. The first to fourth wiring patterns 571bb to 574 provide electrical connection between the first, third, fourth and sixth electrode connectors 541b, 543b, 544b and 546b formed around the first to fourth through electrodes 501 to 504 and the first, third, fourth and sixth terminal junctions 531b, 533b, 534b and 536b to which the first, third, fourth and sixth mounting terminals 31b, 33b, 34b and 36b of the IC3 are joined. These wiring patterns 571b to 574b respectively have constricted portions 5711b, 5722b, 5733b and 5744b smaller in wiring width than the other portions.

Thus, the first to fourth wiring patterns 571b to 574b provide electrical connection between the first to fourth through electrodes 501 to 504 of the first sealing member Sb and the first, third, fourth and six terminal junctions 531b, 533b, 534b and 536b to which the IC3b is joined, third, fourth and sixth electrode connectors 541, 543, 544 and 546 formed, and these wiring patterns 571b to 574b respectively have constricted portions 5711b, 5722b, 5733b and 5744b smaller in wiring width than the other portions. These constricted portions 5711b, 5722b, 5733b and 5744b may serve to prevent the conduction of heat between the first to fourth through electrodes 501 to 504 and the first, third, fourth and six terminal junctions 531b, 533b, 534b and 536b to which the IC3b is joined.

In this manner, the temperature rise gradient of the IC3b may become moderate when the electronic components; heat source, of the external circuit board mounted with the temperature-compensated crystal oscillator 1a are electrically turned on. Further advantageously, the temperature drop gradient of the IC3b may also become moderate when the electronic components; heat source, of the external circuit board are electrically turned off. Thus, possible temperature differences between the IC3b and the crystal vibrator may be controlled, and the state of thermal equilibrium may be quickly reached between these devices. As a result, the frequency drift may be unlikely to occur.

In this embodiment, among the first to sixth electrodes 521b to 526b for mounting purpose on the front surface of the first sealing member 5b, the second and fifth electrodes 522b and 525b that are paired and connected to the driving electrodes 46 and 45 of the crystal vibration plate 4 respectively have a fifth wiring pattern 565b and a sixth wiring pattern 566b. The fifth wiring pattern 565b and the sixth wiring pattern 566b are wiring patterns for driving electrode that are extending inward in the rectangular mounting region Sb where the IC3b is mounted. These wiring patterns 565b and 566b are extending as far as an interval between the first to third mounting terminals 31b to 33b and the fourth to sixth mounting terminals 34b to 36b that are arranged in two rows in the rectangular mounting region Sb in which the IC3b is mounted.

The sixth wiring pattern 566b, in particular, is extending so as to exactly overlap with a rectangular region of projection where a temperature sensor 301b embedded in the IC3b is projected in the mounting region Sb.

In the earlier embodiment, the second and fifth electrode connectors 542a and 545a and the second and fifth terminal junctions 532a and 535a of the second and fifth electrodes 522a and 525a for mounting purpose are spaced apart at an interval as illustrated in FIG. 11, and the these electrode connectors and terminal junctions are electrically interconnected with the fifth and sixth wiring patterns 565 and 566, as illustrated in FIG. 11.

In this embodiment, the second and fifth electrode connectors 542b and 545b and the second and fifth terminal junctions 532b and 535b of the second and fifth electrodes 522b and 525b for mounting purpose are disposed in proximity, and these electrode connectors and terminal junctions are electrically interconnected. The fifth and sixth wiring patterns 565b and 566b are thus not used to electrically interconnect the second and fifth terminal junctions 532b and 535b and the second fifth electrode connectors 542b and 545b. Instead, these wiring patterns solely function as heat conductors.

In the second electrode 522b for mounting purpose having the fifth wiring pattern 565b and the fifth electrode 525b having the sixth wiring pattern 566b according to this embodiment, their patterns are formed to be point-symmetric about a central position O of the mounting region Sb rectangular in plan view, similarly to the earlier embodiment.

The fifth and sixth wiring patterns 565b and 566b in this embodiment are respectively connected to the driving electrodes 46 and 45 of the crystal vibration plate 4, similarly to the earlier embodiment. When heat is radiated from the heated IC3b at higher temperatures than the crystal vibrator 2 and the wiring patterns 565b and 566b are thereby heated, therefore, heat radiated from the heated wiring patterns 565b and 566b is conducted to and heat the driving electrodes 46 and 45 of the crystal vibration plate 4.

Therefore, the heated IC3b radiates heat, cooling down to lower temperature degrees, while the crystal vibrator is heated to higher temperature degrees by heat conducted from the fifth and sixth wiring patterns 565b and 566b heated by the heat radiated from the IC3b. This may effectively control possible temperature differences between the IC3b and the crystal vibrator, allowing the state of thermal equilibrium to be reached between these devices.

Any difference between the temperature of the crystal oscillator 2 and the temperature detected by the temperature sensor 301b of the IC3b may possibly invite frequency variations. Such an unfavorable event, however, may be effectively controlled, and accurate temperature compensation may be thus successfully performed.

Third Embodiment

Figure 13:
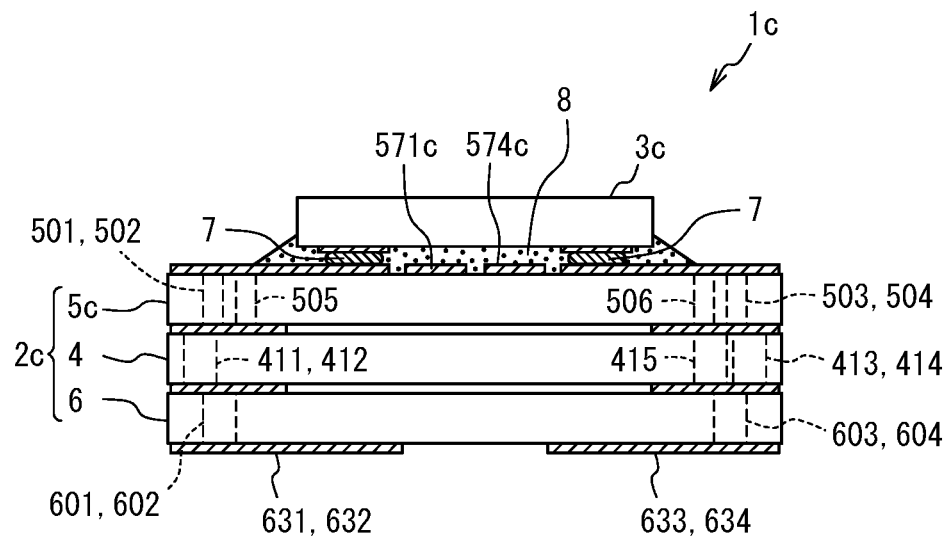
FIG. 13 is a schematic structural view of a temperature-compensated crystal oscillator according to yet another embodiment of the present invention.
Figure 14:
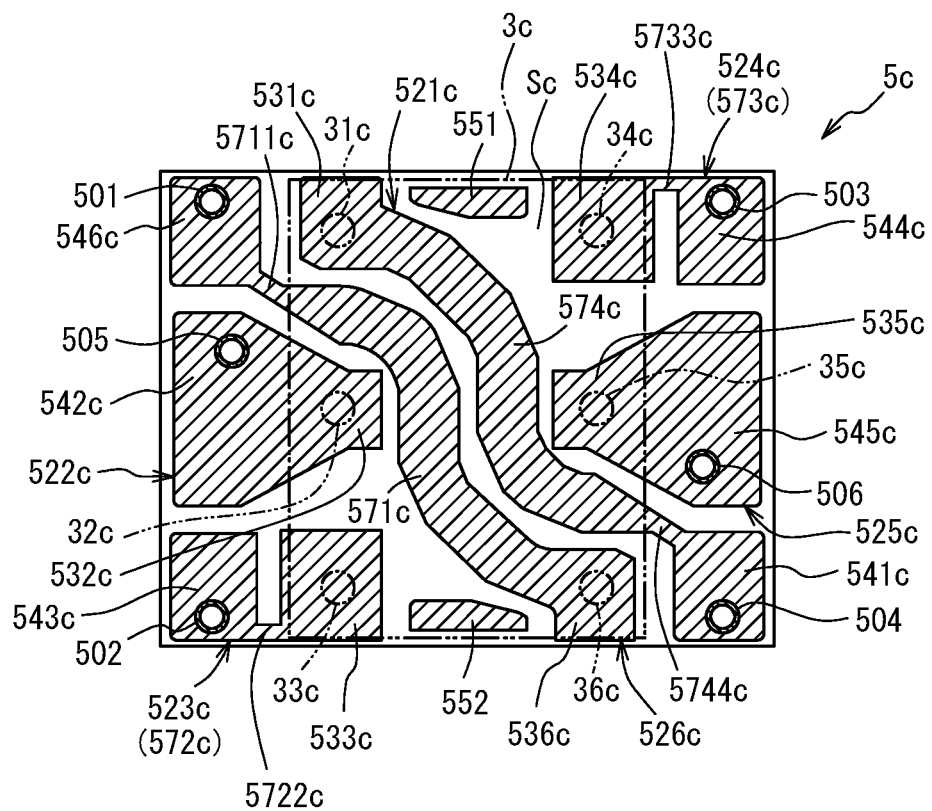
FIG. 14 is a schematic plan view illustrating the side of one main surface of a first sealing member according to the embodiment shown in FIG. 13.

FIG. 13 is a schematic structural view of a temperature-compensated crystal oscillator according to yet another embodiment of the present invention. This drawing is illustrated correspondingly to FIG. 1. FIG. 14 is a schematic plan view illustrating the front-surface side of a first sealing member 5c in a crystal vibrator 2c of a temperature-compensated crystal oscillator 1c shown in FIG. 13. This drawing is illustrated correspondingly to FIG. 4. In these drawings, the same reference signs as in the first embodiment or corresponding reference signs are appended to the same structural elements as described in the first embodiment or corresponding structural elements.

In this embodiment, any technical aspects but the electrode patterns on the front surface of the first sealing member 5c and an IC3c, i.e., the back-surface side of the first sealing member 5c, the crystal vibration plate 4 and the second sealing member 6, are substantially the same as described in the first embodiment illustrated in FIGS. 2, 3 and 5 to 7. These like components and features, therefore, will not be described again in this embodiment.

On the front surface of the first sealing member 5c are formed first to sixth electrodes 521c to 526c to which first to sixth mounting terminals 31c to 36c of the IC3c are connectable, as illustrated in FIG. 14.

In a rectangular mounting region Sc defined with a virtual line where the IC3c is mounted, the first to sixth electrodes 521c to 526c for mounting purpose have first to sixth terminal junctions 531c to 536c including electrode pads (not illustrated in the drawings) to which the mounting terminals 31c to 36c of the IC3c are connectable. The first to sixth electrodes 521c to 526c for mounting purpose further have first to sixth electrode connectors 541c to 546c electrically connectable to the through electrodes, 504, 505, 502, 503, 506 and 501. These electrode connectors 541c to 546c are extending from the first to sixth terminal junctions 531c to 536c in the mounting region Sc toward the outside of the mounting region Sc.

At substantially middle positions in the rectangular region Sc close to its short sides are formed junction patterns 551 and 552 extending along the short sides.

As illustrated in FIG. 14, the first to fourth through electrodes 501 to 504 of the first sealing member 5c are electrically connected, respectively, to the electrode connectors 546c, 543c, 544c and 541c of the sixth, third, fourth and first electrodes 526c, 523c, 524c and 521c for mounting purpose on the front surface of the first sealing member 5c. Therefore, the first to fourth terminals 631 to 634 for external connection on the back surface of the second sealing member 6 are electrically connected, respectively, to the electrode connectors 546c, 543c, 544c and 541c of the sixth, third, fourth and first electrodes 526c, 523c, 524c and 521c for mounting purpose on the front surface of the first sealing member 5c.

Because of the mounting terminals 31 to 36 of the IC3c arranged as illustrated in this embodiment, the sixth electrode connector 546c formed around the first through electrode 501 of the six electrode 526c for mounting purpose is electrically connected to the sixth terminal junction 536c disposed at a distant position via a diagonally extending first wiring pattern 571c.

In the vicinity of the sixth electrode connector 546c formed around the first through electrode 501, the wiring pattern 571c has a constricted portion 5711c smaller in wiring width than the other portions. In the vicinity of the first electrode connector 541c formed around the fourth through electrode 504, the wiring pattern 574c has a constricted portion 5711c smaller in wiring width than the other portions. The constricted portions 5711c and 5744c of the first and fourth wiring patterns 571c and 574c are so shaped that these wiring patterns 571c and 574c are extending in a progressively smaller width from the sixth and first terminal junctions 536c and 531c.

As for the third and fourth electrodes 523c and 524c for mounting purpose of the first sealing member 5c, these electrodes for mounting purpose per se constitute the second and third wiring patterns 572c and 573c for use in electrical connection between the third and fourth electrode connectors 543c and 544c formed around the second and third through electrodes 502 and 503 and the third and fourth terminal junctions 533c and 534c to which the third and fourth mounting terminals 33c and 34c of the IC3c are joined.

At a substantially middle position between the third electrode connector 543c and the third terminal junction 533c, the third electrode 523c for mounting purpose serving as the second wiring pattern 572c has a constricted portion 5722c smaller in wiring width than the other portions. At a substantially middle position between the fourth electrode connector 544c and the fourth terminal junction 534c, the fourth electrode 524c for mounting purpose serving as the third wiring pattern 573c has a constricted portion 5733c smaller in wiring width than the other portions. The constricted portions 5722c and 5733c of the second and third wiring patterns 572c and 573c are formed by cutting the wiring patterns 572c to 573c in part on one side into a thin and long rectangular shape.

Among the first to sixth electrodes 521c to 526c for mounting purpose on the front surface of the first sealing member 6c, the six, third, fourth and first electrodes 526c, 523c, 524c and 521c for mounting purpose, except for the second and fifth electrodes 522c and 525c for mounting purpose that are paired and connected to the first and second driving electrodes 45 and 46 of the crystal vibration plate 4, respectively have first to fourth wiring patterns 571c to 574c. The first to fourth wiring patterns 571c to 574c provide electrical connection between the first to fourth through electrodes 501 to 504 and the sixth, third, fourth and first terminal junctions 536c, 533c, 534c and 531c to which the IC3c is joined. These wiring patterns 571c to 574c respectively have the constricted portions 5711c, 5722c, 5733c and 5744c smaller in wiring width than the other portions. The constricted portions 5711c, 5722c, 5733c and 5744c may successfully prevent the conduction of heat between the first to fourth through electrodes 501 to 504 and the sixth, third, fourth and first terminal junctions 536c, 533c, 534c and 531c to which the sixth, third, fourth and first mounting terminals 36c, 33c, 34c and 31c of the IC3c are joined.

In this manner, the temperature rise gradient of the IC3c may become moderate when the electronic components; heat source, of the external circuit board mounted with the temperature-compensated crystal oscillator 1a are turned on and supplied with electric current, similarly to the first embodiment. Further, the temperature drop gradient of the IC3c may also become moderate when the electronic components of the external circuit board are turned off and no longer supplied with electric current. Thus, possible temperature differences between the IC3c and the crystal vibrator may be effectively controlled, and the state of thermal equilibrium may be quickly reached between these devices. As a result, the frequency drift may be unlikely to occur.

Figure 15A:
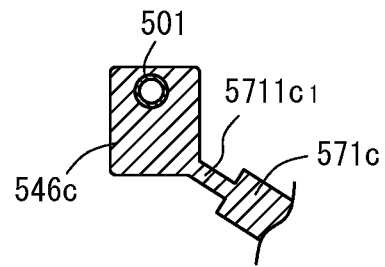
FIG. 15A is a drawing that illustrates a modified example of a constricted portion in a wiring pattern shown in FIG. 14.
Figure 15B:
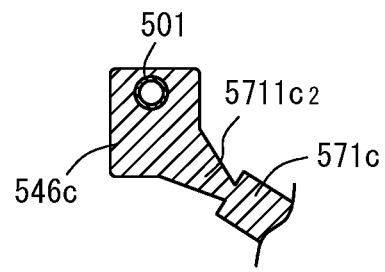
FIG. 15B is a drawing that illustrates another modified example of the constricted portion in the wiring pattern shown in FIG. 14.
Figure 15C:
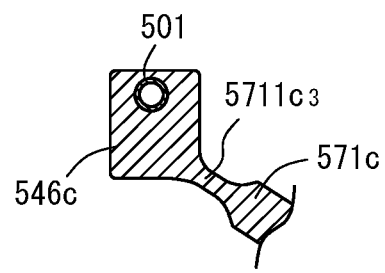
FIG. 15C is a drawing that illustrates yet another modified example of the constricted portion in the wiring pattern shown in FIG. 14.

The constricted portions of the wiring patterns are not necessarily so shaped as thus far described in the embodiments and may have variously different shapes insofar as they are smaller in width than the other portions. The constricted portion 5711c of the first wiring pattern 571c illustrated in FIG. 14, for instance, may be any one selected from the following examples; a constricted portion 5711c1 having a constant width smaller than that of the wiring pattern 571c extending from the six terminal junction 536c in the vicinity of the sixth electrode connector 546c formed around the first through electrode 501, as illustrated in FIG. 15A, a constricted portion 5711c2 progressively reduced in width from the sixth electrode connector 546c formed around the first through electrode 501 toward wiring pattern 571c, as illustrated in FIG. 15B, and a constricted portion 5711c3 constricted in an arc-like shape from both sides of the wiring pattern 571c along its width in the vicinity of the sixth electrode connector 546c formed around the first through electrode 501, as illustrated in FIG. 15C.

In the embodiments described thus far, one wiring pattern has a constricted portion at one position thereof. Instead, one wiring pattern may have constricted portions at two or more positions thereof.

In the embodiments described thus far, the IC is mounted to the first sealing member on the front-surface side of the crystal vibrator. Instead, the IC may be mounted to the second sealing member 6 on the back-surface side of the crystal vibrator.

REFERENCE SIGNS LIST 1, 1a, 1c temperature-compensated piezoelectric oscillator
2, 2a, 2c crystal vibrator
3, 3a, 3c IC (integrated circuit element)
4 crystal vibration plate
5, 5a, 5b, 5c first sealing member
6 second sealing member
7 metal bump (metallic material)
8 underfill resin
31-36,31a-36a first to sixth mounting terminals
31b-36b,31c-36c first to sixth mounting terminals
45, 46 first, second driving electrode
411-415 first to fifth through electrodes
501-506 first to sixth through electrodes
601-604 first to fourth through electrodes
521-526,521a-526a first to sixth electrodes for mounting purpose
521b-526b,521c-526c first to sixth electrodes for mounting purpose
531-536,531a-536a first to sixth terminal junctions
531b-536b,531c-536c first to sixth terminal junctions
541-546, 541a-546a first to sixth electrode connectors
541b-546b,541c-546c first to sixth electrode connectors
571-574, 571a-574a first to fourth wiring patterns
571b-574b,571c-574c first to fourth wiring patterns
565, 566, 565b, 566b wiring pattern for driving electrode
631-634 first to fourth terminals for external connection
S, Sa, Sb, Sc mounting region

The invention claimed is:

1. A piezoelectric vibration device, comprising:
a piezoelectric vibrator comprising a plurality of terminals for external connection and a plurality of electrodes for mounting purpose; and
an integrated circuit element comprising a plurality of mounting terminals connectable to the plurality of electrodes for mounting purpose, the piezoelectric vibrator being mountable to the integrated circuit element,
the piezoelectric vibrator comprising:
a piezoelectric vibration plate comprising driving electrodes formed on main surfaces on both sides thereof;
a first sealing member allowed to cover and seal one of the main surfaces of the piezoelectric vibration plate; and
a second sealing member allowed to cover and seal another one of the main surfaces of the piezoelectric vibration plate,
among the plurality of electrodes for mounting purpose, two paired electrodes for mounting purpose being electrically connected to the driving electrodes formed on the main surfaces, a plurality of remaining electrodes for mounting purpose being electrically connected to the plurality of terminals for external connection,
the plurality of remaining electrodes for mounting purpose each comprising a wiring pattern for use in electrical connection between a respective one of the plurality of terminals for external connection and a respective one of the plurality of mounting terminals of the integrated circuit element,
the wiring pattern in at least one of the plurality of remaining electrodes for mounting purpose comprising a constricted portion smaller in width than other portions thereof, the constricted portion of the wiring pattern having a width smaller than or equal to 40 μm.

2. The piezoelectric vibration device according to claim 1, wherein
the wiring patterns in all of the plurality of remaining electrodes for mounting purpose each have the constricted portion.

3. The piezoelectric vibration device according to claim 1, wherein
the plurality of electrodes for mounting purpose are disposed on an outer surface of the first sealing member,
the plurality of terminals for external connection are disposed on an outer surface of the second sealing member,
the piezoelectric vibrator comprises a plurality of through electrodes penetrating through the first sealing member, the piezoelectric vibration plate and the second sealing member in a direction of thickness thereof, and
the plurality of remaining electrodes for mounting purpose are electrically connected to the plurality of terminals for external connection via the plurality of through electrodes.

4. The piezoelectric vibration device according to claim 2, wherein
the plurality of electrodes for mounting purpose are disposed on an outer surface of the first sealing member,
the plurality of terminals for external connection are disposed on an outer surface of the second sealing member,
the piezoelectric vibrator comprises a plurality of through electrodes penetrating through the first sealing member, the piezoelectric vibration plate and the second sealing member in a direction of thickness thereof, and
the plurality of remaining electrodes for mounting purpose are electrically connected to the plurality of terminals for external connection via the plurality of through electrodes.

5. The piezoelectric vibration device according to claim 3, wherein
the constricted portion of the wiring pattern is formed at a position closer to a respective one of the plurality of through electrodes than a connecting portion for connection between a respective one of the plurality of electrodes for mounting purpose and a respective one of the plurality of mounting terminals of the integrated circuit element.

6. The piezoelectric vibration device according to claim 4, wherein
the constricted portion of the wiring pattern is formed at a position closer to a respective one of the plurality of through electrodes than a connecting portion for connection between a respective one of the plurality of electrodes for mounting purpose and a respective one of the plurality of mounting terminals of the integrated circuit element.

7. The piezoelectric vibration device according to claim 3, wherein
the constricted portion of the wiring pattern is formed outside of a mounting region where the integrated circuit element is mounted.

8. The piezoelectric vibration device according to claim 4, wherein
the constricted portion of the wiring pattern is formed outside of a mounting region where the integrated circuit element is mounted.

9. The piezoelectric vibration device according to claim 5, wherein
the constricted portion of the wiring pattern is formed outside of a mounting region where the integrated circuit element is mounted.

10. The piezoelectric vibration device according to claim 6, wherein
the constricted portion of the wiring pattern is formed outside of a mounting region where the integrated circuit element is mounted.

11. The piezoelectric vibration device according to claim 1, wherein
the plurality of mounting terminals are disposed at positions closer to an outer circumference of the integrated circuit element, and
the two paired electrodes for mounting purpose electrically connected to the driving electrodes formed on the main surfaces each have a wiring pattern for driving electrode extending more inward than the plurality of mounting terminals in the mounting region where the integrated circuit element is mounted.

12. The piezoelectric vibration device according to claim 1, wherein
the plurality of mounting terminals are disposed at positions closer to an outer circumference of the integrated circuit element, and
the two paired electrodes for mounting purpose electrically connected to the driving electrodes formed on the main surfaces each have a wiring pattern for driving electrode extending more inward than the plurality of mounting terminals in the mounting region where the integrated circuit element is mounted.

13. The piezoelectric vibration device according to claim 11, wherein
the wiring patterns for driving electrode of the two paired electrodes for mounting purpose are substantially symmetric to each other in which a central position of the mounting region of the integrated circuit element is a point of symmetry.

14. The piezoelectric vibration device according to claim 12, wherein
the wiring patterns for driving electrode of the two paired electrodes for mounting purpose are substantially symmetric to each other in which a point of symmetry is a central position of the mounting region of the integrated circuit element.

15. The piezoelectric vibration device according to claim 11, wherein
the wiring patterns for driving electrode of the two paired electrodes for mounting purpose are at least extended as far as a near-center position in the mounting region of the integrated circuit element.

16. The piezoelectric vibration device according to claim 12, wherein
the wiring patterns for driving electrode of the two paired electrodes for mounting purpose are at least extended as far as a near-center position in the mounting region of the integrated circuit element.

17. The piezoelectric vibration device according to claim 13, wherein
the wiring patterns for driving electrode of the two paired electrodes for mounting purpose are at least extended as far as a near-center position in the mounting region of the integrated circuit element.

18. The piezoelectric vibration device according to claim 14, wherein
the wiring patterns for driving electrode of the two paired electrodes for mounting purpose are at least extended as far as a near-center position in the mounting region of the integrated circuit element.

* * * * *